(12) United States Patent
Park et al.

(10) Patent No.: US 8,551,689 B2
(45) Date of Patent: Oct. 8, 2013

(54) METHODS OF MANUFACTURING SEMICONDUCTOR DEVICES USING PHOTOLITHOGRAPHY

(75) Inventors: Mi-Ra Park, Seoul (KR); Kyoung-Mi Kim, Anyang-si (KR); Jeong-Ju Park, Hwaseong-si (KR); Bo-Hee Lee, Gunpo-si (KR); Jae-Ho Kim, Yongin-si (KR); Young-Ho Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 215 days.

(21) Appl. No.: 13/117,667

(22) Filed: May 27, 2011

(65) Prior Publication Data

US 2011/0294072 A1 Dec. 1, 2011

(30) Foreign Application Priority Data

May 27, 2010 (KR) .................. 10-2010-0049813
Jun. 7, 2010 (KR) .................. 10-2010-0053453

(51) Int. Cl.
*G03F 7/26* (2006.01)
(52) U.S. Cl.
USPC ................................................. 430/314
(58) Field of Classification Search
USPC .......................................... 430/311, 313, 314
See application file for complete search history.

(56) References Cited

U.S. PATENT DOCUMENTS

2007/0148983 A1* 6/2007 Lee et al. .................. 438/717
2011/0300712 A1* 12/2011 Kim et al. .................. 438/703

FOREIGN PATENT DOCUMENTS

| JP | 2008-198988 | | 8/2008 |
| KR | 100320445 | B1 | 12/2001 |
| KR | 1020060106104 | A | 10/2006 |

OTHER PUBLICATIONS

Seraphim, "Principles of Electronic Packaging", 1989, pp. 377-379.*

* cited by examiner

*Primary Examiner* — Kathleen Duda
(74) *Attorney, Agent, or Firm* — Myers Bigel Sibley & Sajovec, P.A.

(57) ABSTRACT

A method of manufacturing a semiconductor device using a photolithography process may include forming an anti-reflective layer and a first photoresist film on a lower surface. The first photoresist film may be exposed to light and a first photoresist pattern having a first opening may be formed by developing the first photoresist film. A plasma treatment can be performed on the first photoresist pattern and a second photoresist film may be formed on the first photoresist pattern, which may be exposed to light. A second photoresist pattern may be formed to have a second opening by developing the second photoresist film. Here, the second opening may be substantially narrower than the first opening.

23 Claims, 25 Drawing Sheets

METHODS OF MANUFACTURING SEMICONDUCTOR DEVICES USING PHOTOLITHOGRAPHY

CROSS REFERENCE TO RELATED APPLICATIONS

This application claims priority under 35 USC §119 to Korean Patent Application No. 2010-49813, filed on May 27, 2010 in the Korean Intellectual Property Office (KIPO), and to Korean Patent Application No, 10-2010-0053453, filed Jun. 7, 2010, the contents of each of which are incorporated herein by reference in their entireties.

BACKGROUND

1. Field

Example embodiments relate to the field of semiconductor devices, and more particularly, to the formation of semiconductor devices using photolithography technology.

2. Description of the Related Art

In some conventional photolithography processes, the resolution of light generated from a light source may increase as the wavelength of light decreases. For example, a conventional photolithography process may be performed using a krypton fluoride (KrF) laser beam having a wavelength of about 248 nm or an argon fluoride (ArF) laser beam having a wavelength of about 193 nm.

SUMMARY

Embodiments according to the inventive concept provide methods of forming semiconductor devices using photolithography. Pursuant to these embodiments according to the inventive concept, an anti-reflective layer and a first photoresist film may be formed on a lower surface to be etched. The first photoresist film may be exposed to light and a first photoresist pattern having a first opening may be formed by developing the first photoresist film. A plasma treatment may be performed on the first photoresist pattern. A second photoresist film may be formed on the first photoresist pattern. The second photoresist film may be exposed to light. A second photoresist pattern may be formed to have a second opening by developing the second photoresist film. Here, the second opening may be substantially narrower than the first opening.

In some embodiments according to the inventive concept, the method may further include etching the lower surface using the first photoresist pattern and the second photoresist pattern as etching masks to form a pattern in the lower surface having an opening. In some embodiments according to the inventive concept, the opening in the pattern in the lower surface may be a contact hole. In some embodiments according to the inventive concept, the width of the contact hole may be less than about 30 nm and greater than about 1 nm.

In some embodiments according to the inventive concept, the method may further include performing a first baking process on the first photoresist film after exposing the first photoresist film and performing a second baking process on the second photoresist film after exposing the second photoresist film.

In some embodiments according to the inventive concept, the plasma treatment may be performed using a plasma generated from a hydrogen bromide (HBr) gas, a hydrogen chloride (HCl) gas, a helium (He) gas, a neon (Ne) gas, a nitrogen ($N_2$) gas, an argon (Ar) gas, etc. These may be used alone or in a combination thereof.

In some embodiments according to the inventive concept, the method of forming a photoresist pattern may be provided by treating a first photoresist pattern with a plasma to provide a transmuted photoresist pattern having first openings on a lower surface and an anti-reflective layer. A photoresisit film may be formed on the transmuted photoresist pattern and the photoresisit film may be patterned to provide a second photoresist pattern. The second photoresist pattern may be selectively etched to expose the anti-reflective layer in second openings that are within and substantially narrower than the first openings.

In some embodiments according to the inventive concept, the first photoresist pattern may be formed using a first photolithographic mask having openings and the second photoresist pattern may be formed using a second photolithographic mask having openings that are substantially equal to the openings in the first photolithographic mask. In some embodiments according to the inventive concept, portions of the second photoresist pattern may be left in contact with side walls of transmuted photoresist pattern.

In some embodiments according to the inventive concept, a method of forming a photoresist pattern may be provided by forming an anti-reflective layer on a lower surface and forming a first photoresist film on the anti-reflective layer. The first photoresist film may be patterned using a mask to provide a first photoresist pattern covering the anti-reflective layer. The first photoresist pattern may be treated with a plasma to provide a transmuted photoresist pattern. Here, reflectivity of the transmuted photoresist pattern may be substantially greater than reflectivity of the first photoresist pattern. A second photoresisit film may be formed on the transmuted photoresist pattern and the photoresisit film may be patterned using the mask to provide a second photoresist pattern and the first and second photoresist patterns may be used to selectively expose the anti-reflective layer.

In some embodiments according to the inventive concept, the first photoresist pattern may be treated using a plasma generated from a hydrogen bromide (HBr) gas, a hydrogen chloride (HCl) gas, a helium (He) gas, a neon (Ne) gas, a nitrogen ($N_2$) gas, an argon (Ar) gas, etc. These may be used alone or in a mixture thereof. In some embodiments according to the inventive concept the first photoresist pattern may be treated using a plasma for about 1 second to about 300 seconds.

In some embodiments according to the inventive concept, portions of the second photoresist pattern may be left in contact with side walls of transmuted photoresist pattern.

DESCRIPTION OF EMBODIMENTS ACCORDING TO THE INVENTIVE CONCEPT

Figure 1:
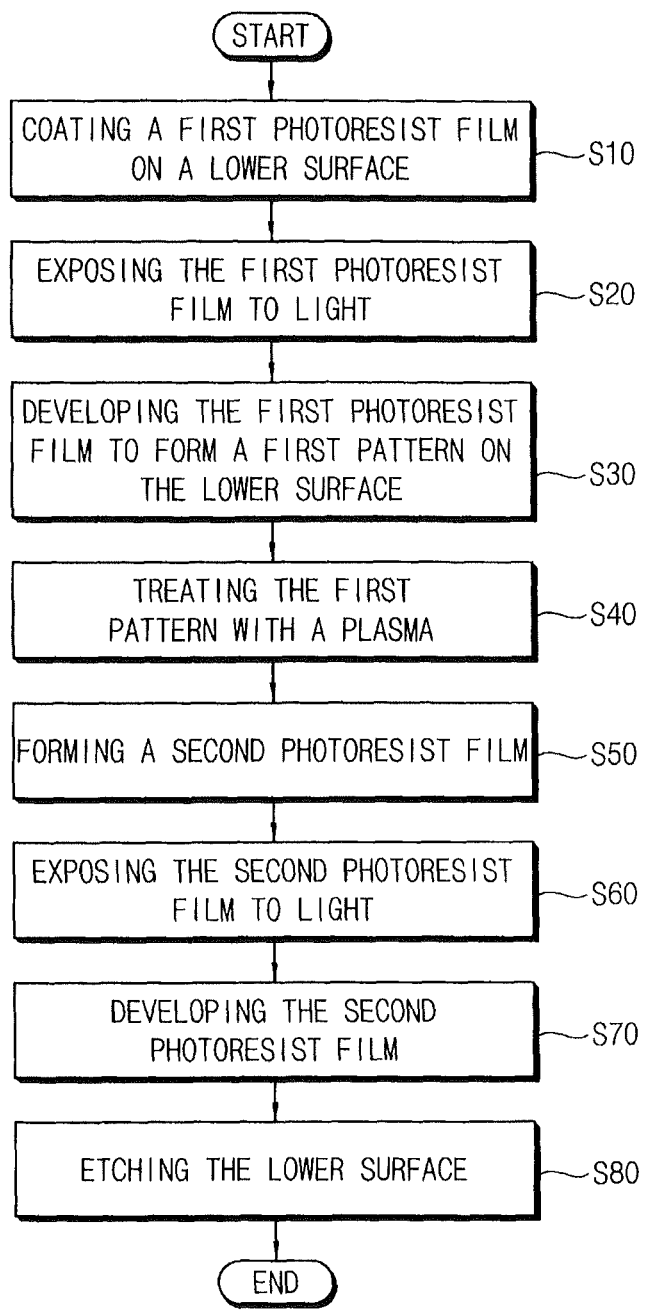
FIG. 1 is a flow chart illustrating a method of patterning a lower surface using a photolithography process in some embodiments according to the inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to unimplanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

The term, "a photolithography process" may include a process for forming a desired fine pattern of a layer, a film, an object, a substrate, etc. For example, a minute pattern having a width below about 10 micrometers may be obtained by the photolithography process.

"Interference" may indicate phenomenon in which the intensity of waves may be increased or decreased in accordance with overlapping of the waves. "Constructive interference" may represent the increase of intensities (amplitudes) of waves when the phase difference between the waves is substantially identical. For example, the constructive interference of the waves may occur when the path difference of the waves corresponds to multiples of an even number by a half wave length of the wave. "Destructive interference" may indicate the decrease of intensities (amplitudes) of waves in cases where the phases of the waves are substantially opposed each other. For example, destructive interference may be caused when the path difference of the waves corresponds to multiples of an odd number by a half of the wave length of the wave.

"Diffraction" may refer to various phenomena which occur when a wave encounters an obstacle. The diffraction phenomenon may be described as the apparent bending of waves around small obstacles and the spreading out of waves past small openings. Similar effects may occur when light waves travel through a medium with a varying refractive index. Diffraction may occur with all waves, including electromagnetic waves such as visible light, x-rays, radio waves, etc. As physical objects have wave-like properties (at the atomic level), diffraction also occurs with matter and may be studied according to the principles of quantum mechanics. While diffraction occurs whenever propagating waves encounter such changes, its effects may be generally most pronounced for waves where the wavelength is on the order of the size of the diffracting objects. If the obstructing object provides multiple, closely-spaced openings, a complex pattern of varying intensity may result. This is due to the superposition, or interference, of different parts of a wave that traveled to the observer by different paths. The formalism of diffraction may also describe the way in which waves of finite extent propagate in free space. For example, the expanding profile of a laser beam, the beam shape of a radar antenna and the field of view of an ultrasonic transducer may be described using diffraction.

"Resolution" may indicate a distance between two points of an object identified using an optical apparatus. Generally, the resolution may be represented by the following relationship:

$$\text{Resolution}=\kappa 1 \times (\pi/NA)$$

Wherein, $\kappa 1$ means a specific constant depending on a photoresist composition and/or the optical apparatus such as a photolithography apparatus. Further, $\lambda$ indicates a wavelength of a light employed in the optical apparatus, and NA represents a numerical aperture of lens in the optical apparatus.

"A reticle" or "a mask" may include a predetermined structure which is transferred to a layer, a film, an object, a substrate, etc. In general, the reticle or the mask may include planar predetermined structure to determine desired structure of the layer, the film, the object, the substrate, etc. For example, the reticle or the mask may have a plurality of multiple slits or grids for generating various effects of lights such as diffraction, interference, refraction, etc.

"A pattern" may represent a desired structure in accordance with the predetermined structure of the reticle or the mask. For example, the predetermined structure of the reticle or the mask may be transferred to a layer, a film, an object or a substrate so that a pattern of the layer, the film, the object or the substrate may be obtained. "A patterning process" may include a process of transferring the predetermined structure of the reticle or the mask to the layer, the film, the object or the substrate such that the layer, the film, the object or the substrate may have a pattern of a desired structure.

"A lower surface" may be a face of an object, a layer, a film or a substrate, which is desirably etched to form a pattern of the object, the layer, the film or the substrate. For example, the lower surface may include at least one layer or film having at least one pattern that has a structure transferred from the predetermined structure of the mask or the reticle. Further, the lower surface may include a photoresist film, a processed substrate, a raw substrate, etc. The lower surface may have two dimensional structure and/or a three dimensional structure including a rugged surface or a concave and convex surface. In some embodiments according to the inventive concept. a photoresist film may be provided on the lower surface and also an additional layer may be interposed between the lower surface and the photoresist film. For example, an anti-reflective layer may be formed between the lower surface and the photoresist film.

"Photoresist" may represent is a light-sensitive material used in several industrial processes, such as photolithography process and a photoengraving process to form a patterned coating on a surface. Photoresists are classified into two groups such as positive resists and negative resists. A positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The unexposed portion of the photoresist is dissolved by the photoresist developer. The most important light types include UV, DUV and the H and I lines of a mercury-vapor lamp. Photoresists may be most commonly used at wavelengths in the ultraviolet spectrum or shorter (below about 400 nm). Photoresists may also be exposed by electron beams, producing the same results as exposure by light. It will be understood that, while photons are absorbed, depositing all their energy at once, electrons depositing their energy gradually, and scatter within the photoresist during this process. As with high-energy wavelengths, many transitions are excited by electron beams and heating and out gassing are still concerned.

"A developing process" may include the process step that follows resist exposure, which is done to leave behind the correct resist pattern on the wafer which will serve as the mask that covers areas on the wafer to be protected from chemical attack during subsequent etching, implantation, lift-off, and the like. The developing process may involve chemical reactions wherein unprotected parts of the resist get dissolved in the developer. A good developing process may have a short duration (less than a minute), results in minimum pattern distortion or swelling, keeps the original film thickness of protected areas intact, and recreates the intended pattern accurately. The developing process may be carried out either by immersion developing, spray developing, or puddle developing, followed by thorough rinsing and drying to ensure that the development action will not continue after the developer has been removed from the wafer surface.

"Plasma" may indicate a state of matter similar to gas in which a certain portion of the particles are ionized. The basic premise is that heating a gas dissociates its molecular bonds, rendering it into its constituent atoms. Further heating leads to ionization (a loss of electrons), turning it into the plasma: containing charged particles, positive ions and negative electrons. "A plasma treatment" may include a process of treating an object, a layer, a film, a substrate or a lower surface with the energy of plasma and ingredients included in the plasma.

"An opening" may include a hole, a window, a recess or a groove formed on a surface of an object such as a layer, a film, a substrate, etc. The opening may have a closed upper portion or an opened upper portion.

"Transmutation" may indicate a change of properties in a layer, a film, an object, a substrate or a lower surface after performing a plasma treatment or a thermal treatment about the layer, the film, the object, the substrate or the lower surface. The transmutation of the layer, the film, the object, the substrate or the lower surface may be different from "change" of a photoresist film caused by a reaction after irradiating a light onto the photoresist film.

"A baking process" or "a bake process" may include a process of substantially increasing a temperature of a layer, a film, an object, a substrate or a lower surface including a layer or a film.

"A soft baking process" may include a process of substantially increasing a temperature of a layer, a film, an object, a substrate, or a lower surface including a layer or a film before an exposure process performed about the layer, the film, the object, the substrate, or the lower surface including a layer or a film, A "hard baking process" may include a process of substantially increasing the temperature of the layer, the film, the object, the substrate, or the lower surface including a layer or a film after executing a developing process about the layer, the film, the object, the substrate or the lower surface including a layer or a film. For example, the soft baking process may be carried out at a temperature in a range of about 30° C. to about 110° C. Additionally, the hard baking process may be executed at a temperature in a range of about 80° C. to about 160° C.

"A baking process after an exposure" may include a process of substantially increasing a temperature of a layer, a film, an object, a substrate, or a lower surface including a layer or a film after an exposure process.

"Dimension" may include a width, a length, a height and/or a depth of an opening, a layer, a film, an object, a substrate, or a lower surface including a layer or a film. "Minimum dimension" may represent the smallest dimension of the opening, the layer, the film, the object, the substrate, or the lower surface including a layer or a film.

According to example embodiments, a fine pattern having a minute opening such as a contact hole may be obtained using a conventional photolithography apparatus without modifying the construction of the photolithography apparatus. Further, the fine pattern in a semiconductor device may be formed using a conventional photo mask without changing the design of photo mask. Therefore, the semiconductor device including the fine pattern may be obtained by more simplified processes, and a cost for manufacturing the semiconductor device may be reduced.

FIG. 1 is a flow chart illustrating a method of patterning a lower surface by a photolithography process in accordance with example embodiments.

Referring to FIG. 1, in step S10, a first photoresist film may be coated on a lower surface on which a layer and/or a film will be formed. As described above, the lower surface may include a layer, a film, a substrate or the like. The first photoresist film may be formed by a spin coating process. The first photoresist film may be formed using positive photoresist or negative photoresist. The first photoresist film may be uniformly formed on the lower surface or a layer provided on the lower surface.

The first photoresist film on the lower surface may be exposed to light in step S20. In some embodiments according to the inventive concept, a photolithography process for the lower surface may include irradiating (or impinging) light on the first photoresist film formed on the surface after the light passes through a reticle (or a mask) and a lens of a photolithography apparatus. The first photoresist film formed on the lower face may include photosensitive photoresist having properties changed by irradiating light onto the first photoresist film. A pattern or a desired structure of the mask may be transferred to the lower surface through the first photoresist film.

The first photoresist film may be divided into an exposed portion having properties by an exposure of the first photoresist film, and an unexposed portion on which the light is not irradiated. In step S30, the first photoresist film may be developed using a developing solution to form a first pattern on the lower surface because of a difference of the solubility or the reactivity of the developing solution between the exposed and the unexposed portions of the first photoresist film. The first pattern of the first photoresist film may have a predetermined structure in accordance with the desired structure of the reticle or the mask. The first pattern may expose a portion of the lower surface. The exposed portion of the lower surface may be etched using the first pattern as an etching mask. Therefore, the first pattern of the first photoresist film may be transferred to the lower surface, so that the lower surface may be patterned to have in a desired structure.

In some embodiments according to the inventive concept, the lower surface may be partially etched by an anisotropic etching process or an isotropic etching process. In this case, the anisotropic etching process may be more suitable rather than an isotropic process to obtain the lower surface having a precise structure. The anisotropic process for the lower surface may include a dry etching process or a wet etching process.

In some example embodiments, after forming the first pattern by developing the first photoresist film, a second photoresist film may be additionally coated on the first pattern in step S50 without directly etching the lower surface. Here, the second photoresist film may be formed on the lower surface to cover the first pattern. After exposing the second photoresist film to light in step S60, the second photoresist film may be developed using a developing solution in step S70. Thus, an exposed portion of the second photoresist film may be removed to form a second pattern of the second photoresist film. The lower surface may be partially etched simultaneously using the first and the second patterns as etching masks. As a result, the lower surface may have a finer and more precise pattern in comparison with a pattern formed using the conventional photolithography apparatus. That is, the pattern of the lower surface may have a minute pattern compared to the pattern obtained by the conventional photolithography process.

In some example embodiments, an anti-reflective layer may be additionally formed between the lower surface and the first photoresist film. After forming the first pattern of the first photoresist film on the lower surface in step S30, at least one of the first pattern and the anti-reflective layer may be treated by an additional process, so that properties of the first pattern and/or the anti-reflective layer may be changed to provide the pattern of the lower surface having a desirably fine and accurate dimension. The first pattern and/or the anti-reflective layer may be treated with a plasma in step S40. For example, a plasma treatment for the first pattern and/or the anti-reflective layer may be carried out using a plasma generated from a hydrogen halide gas including a hydrogen bromide (HBr) gas, a hydrogen chloride (HCl) gas, etc. Alternatively, the plasma treatment may be performed using a plasma generated from an inactive gas such as an argon (Ar) gas, a neon (Ne) gas, a helium (He) gas, a nitrogen ($N_2$) gas, etc.

According to example embodiments, the first pattern and/or the second pattern may have a minute width below about 50 nm. For example, the first pattern and/or the second pattern may have a critical width in a range of about 17 nm to about 30 nm. The plasma treatment process may be executed for about 1 second to about 300 seconds. However, the process time of the plasma treatment may vary in accordance with the dimension of the first pattern and/or the second pattern.

In some example embodiments, the photoresist in the first photoresist film and/or the second photoresist film may be coated on the lower surface as a state of a fluid or a solution (a solvent) that includes a polymer resin. The surface having the first photoresist film and/or the second photoresist film may be thermally treated to remove the solvent from the first photoresist film and/or the second photoresist film. For example, a temperature of the lower surface having the first photoresist film and/or the second photoresist film may be increased by a baking process.

The photoresist of the first photoresist film and/or the second photoresist film may include positive type photoresist and negative type photoresist. When the first photoresist film and/or the second photoresist film includes positive photoresist, an exposed portion of the first photoresist film and/or the second photoresist film may be dissolved by the developing solution. However, an exposed portion of the first photoresist film and/or the second photoresist film may be undissolved by the developing solution in case that the first photoresist film and/or the second photoresist film includes negative photoresist.

When the first photoresist film and/or the second photoresist film includes positive photoresist, the exposed portion of the first photoresist film and/or the second photoresist film may be removed by a developing process, so that an unexposed portion of the first photoresist film and/or the second photoresist film may remain on the lower surface to from the first pattern and/or the second pattern. In case that the first photoresist film and/or the second photoresist film includes negative photoresist, the unexposed portion of the first photoresist film and/or the second photoresist film may be removed by a developing process, such that an exposed portion of the first photoresist film and/or the second photoresist film may remain to provide the first pattern and/or the second pattern on the lower surface.

The lower surface may be partially etched using the first pattern and/or the second pattern as an etching mask in step S80, so that the lower surface may include a fine pattern having a structure transferred from the predetermined structure of the mask or the reticle. When an ashing process and/or a stripping process may be performed about the lower surface to remove the remaining first pattern and/or the remaining second pattern, a desired pattern of the lower surface may be obtained.

In some embodiments according to the inventive concept, the pattern of the lower surface may have various structures as occasion demands. For example, the pattern of the lower surface may have a line shape, a bar shape, an opening shape having a high aspect ratio, etc. Here, the pattern having the opening structure may correspond to a contact hole, which has a minute width in a range of about 15 nm to about 50 nm.

FIG. 2 to FIG. 13B are cross-sectional views and plan views illustrating a method of forming a fine pattern having a contact hole by etching a lower surface using positive type photoresist. FIGS. 2, 3, 4A, 5A, 6, 7A, 8A, 9, 10A, 11A, 12A and 13A are cross sectional views illustrating methods of forming a pattern of a lower surface by a photolithography process using a positive type photoresist. FIGS. 4B, 5B, 7B, 8B, 10B, 11B, 12B and 13B are plan views illustrating methods of forming the pattern of the lower surface by the photolithography process using a positive type photoresist.

Figure 2:
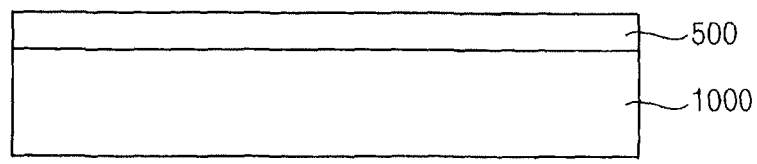
FIGS. 2, 3, 4A, 5A, 6, 7A, 8A, 9, 10A, 11A, 12A and 13A are cross sectional views illustrating a method of forming a pattern of a lower surface by a photolithography process using positive type photoresist in some embodiments according to the inventive concept.

Referring to FIG. 2, after preparing a lower surface 1000 to be etched, an anti-reflective layer (or an anti-reflective film) 500 may be formed on the lower surface 1000. The lower surface 1000 may include a film, a layer, an object or a substrate that will be etched to have a desired fine pattern. In some embodiments according to the inventive concept, the lower surface 1000 may include a raw semiconductor substrate, a semiconductor substrate being treated by predetermined processes, etc. The lower surface 1000 may include a photoresist film coated thereon. A predetermined pattern of a first mask 800p (see FIG. 3) will be transferred to a first photoresist film 100 formed on the lower surface 1000 having the anti-reflective layer 500.

The lower surface 1000 may have a level upper portion as illustrated in FIG. 2. In some example embodiments, the lower surface 1000 may have a concave and convex upper portion that includes a single layer (film) or a composite layer (film). Namely, the lower surface 1000 may have a rugged three dimensional upper portion including at least one layer (film).

In some example embodiments, an additional layer or an additional film may be provided between the lower surface 1000 and the anti-reflective layer 500. In this case, the additional layer (film) and the lower surface 1000 may be simultaneously etched while partially etching the lower surface 1000 in a successive etching process. Alternatively, the additional film (layer) and the lower surface 1000 may be successively etched.

In some example embodiments, an optical control layer or film may be additionally coated on the lower surface 1000. The optical control layer may reduce the intensity of light generated by the reflection of light from the lower surface 1000 and from an interface between the lower surface 1000 and the anti-reflective layer 500.

The anti-reflective layer 500 may include an organic anti-reflective film and/or an inorganic anti-reflective film. The inorganic anti-reflective film may include a carbon film, a silicon nitride (SiNx) film, a silicon oxynitride (SiNxOy) film, etc. The organic anti-reflective film may include an organic material. When the anti-reflective layer 500 includes an inorganic material, the anti-reflective layer 500 may prevent and/or may reduce the reflection of the light by absorbing and weakening the intensity of the reflected light at a lower face of the anti-reflective layer 500. When the anti-reflective layer 500 includes the organic anti-reflective film, the anti-reflective layer 500 may prevent and/or reduce the reflection of the light by decreasing the intensity of the reflected light utilizing the constructive interference of the light and the destructive interference of the light.

In some embodiments according to the inventive concept, the anti-reflective layer 500 may include one of the inorganic anti-reflective film and the organic anti-reflective layer. Alternatively, the anti-reflective layer 500 may include both of the organic anti-reflective film and the inorganic anti-reflective film. Here, the organic anti-reflective film and the inorganic anti-reflective film may be successively formed on the lower surface 1000.

Figure 3:
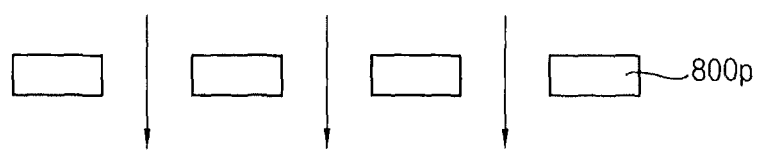
Figure 3:
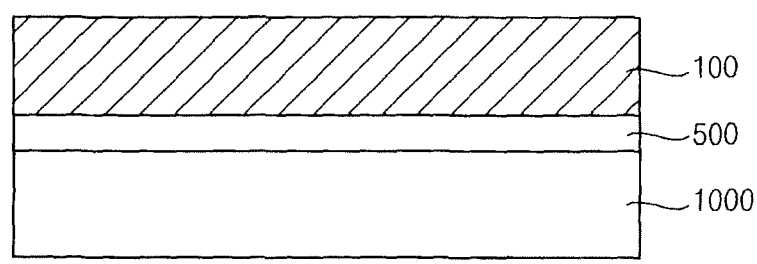
Figure 26:
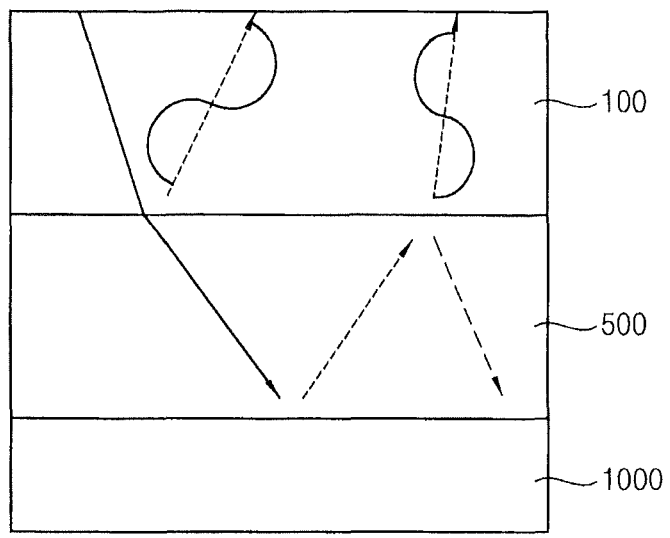
FIG. 26 is a cross sectional view illustrating paths of lights in an anti-reflective layer and a photoresist film in some embodiments according to the inventive concept.

Referring to FIG. 3, the first photoresist film 100 may be formed on the anti-reflective layer 500. FIG. 26 is a cross-sectional view illustrating exemplary paths of light through the anti-reflective layer 500 and the first photoresist film 100.

As illustrated in FIG. 26, the anti-reflective layer 500 may cause the destructive interference of the light reflected from the lower surface 1000 so as to prevent and/or reduce the intensity of the reflected light. Therefore, a pattern 1000p (see FIG. 13A) of the lower surface 1000 may have the desired dimensions because of the anti-reflective layer 500. That is, the pattern 1000p of the lower surface 1000 may have a desired structure (or dimensions) by reducing the degradation of the pattern caused by the reflected light from the lower surface 1000 after the light passes the first photoresist film 100.

In some embodiments according to the inventive concept, the first photoresist film 100 may include a photosensitive polymer. When the light is irradiated onto the first photoresist film 100, a portion of the first photoresist film 100 may have characteristics changed by the incident light. For example, the solubility and/or the reactivity of the portion of the first photoresist film 100 with respect to a developing solution may be increased or reduced to selectively form a first photoresist pattern 110 (see FIG. 5A) on the anti-reflective layer 500. This first photoresist pattern 110 may serve as an etching mask for patterning the lower surface 1000 in an etching process, for example, a dry etching process or a wet etching process.

In some embodiments according to the inventive concept, the first photoresist film 100 may be exposed to a white light or a single color light having a single wavelength. Additionally, a laser beam having a one wavelength may be used to expose the first photoresist film 100. For example, the first photoresist film 100 may be exposed using an i-line laser beam having a wavelength of about 365 nm, a g-line laser beam having a wavelength of about 436 nm, an h-line laser beam having a wavelength of about 405 nm, a krypton fluoride (KrF) laser beam having a wavelength of about 248 nm, an argon fluoride (ArF) laser beam having a wavelength of about 193 nm, etc. Furthermore, a deep ultraviolet (DUV) ray having a wavelength of about 258 nm may be employed to expose the first photoresist film 100. However, other laser beams having various wavelengths may be sufficiently used in an exposure process for the first photoresist film 100 without limiting the above-mentioned laser beams.

In some embodiments according to the inventive concept, the first photoresist film 100 may be exposed using an exposure apparatus that includes a light source, a lens, a reticle (or a mask), etc. The light source may generate a predetermined laser beam and the lens may disperse or concentrate the laser beam. Further, the reticle may have a predetermined pattern transferred to the first photoresist film 100. The lens may have a relatively large numerical aperture (NA) and the light source may emit a laser beam having a relatively short wavelength, so that the reticle may close on the first photoresist film 100 and the lower surface 1000. Further, the lens having the large numerical aperture may easily ensure focusing of the reticle including a desired pattern on a predetermined portion of the first photoresist film 100 for precisely patterning the lower surface 1000.

In some example embodiments, the first photoresist film 100 may be patterned using an immersion lithography apparatus. The immersion lithography apparatus may include a fluid (e.g., water having a refractive index of about 1.44) filled between the lower surface 1000 and a projection lens or an object lens. Thus, the resolution of the laser beam may be improved and the focusing range of the laser beam may also be increased, thereby accurately patterning the lower surface 1000 using the first photoresist pattern 110. In this case, water having a high refraction index may be disposed between the lens and the lower surface 1000 while maintaining the wavelength of the laser beam, such that the immersion lithography apparatus may have an enhanced depth of focus (DOF) and the focusing range and the resolution of the laser beam may be improved by decreasing an incident angle of the laser beam irradiated into the first photoresist film 100. Further, the immersion lithography apparatus may include a lens having a numerical aperture greater than about one because totally reflected laser beam between among the first photoresist film 100, the anti-reflective layer 500 and the lower surface 1000 may be emitted toward outside.

In some example embodiments, the first photoresist film 100 may be formed using a resist composition that has a relatively high molecular weight in a range of about several thousands to about several tens of thousands. A monomer included in the resist composition may be a mixture including a resin that has a plurality of repeatedly arranged monomers. Additionally, the resist composition may include a polymer for connecting the monomers having desirably various functions and easily forming the first photoresist film 100. For example, the resist composition may include a photosensitive polymer and/or a mixture of a photosensitive molecules and a polymer. Here, the photosensitive polymer and the photosensitive molecules may have variable solubility caused by chemical reaction therein with respect to a developing solution when the photosensitive polymer and the photosensitive molecules are exposed to light. The resist composition may be provided on the anti-reflective layer 500 as a liquid state or a solution state. Further, the resist composition may additionally include additives, for example, a solvent, a photosensitive resin, a basic quencher, an inhibitor, a surfactant, a photoreaction material, a reactive catalyst, etc.

In some example embodiments, the photosensitive resin included in the resist composition may have characteristics varied in accordance with a major wavelength of light incident onto the photoresist composition. When the first photoresist film 100 is exposed to a krypton fluoride (KrF) laser beam, the photosensitive resin may include a moiety of a polymer having an aromatic ring, for example, a benzene ring. In case that the first photoresist film 100 is exposed to an argon fluoride (ArF) laser beam having a relatively short wavelength, the photosensitive composition may include a unit of acrylate, an aliphatic ring, an aliphatic fused ring, etc. An example of the polymer having the aromatic ring may include novolac resin, and an example of the aliphatic ring may include a cyclohexyl ring. An example of the aliphatic fused ring may include an adamantly ring. Additionally, the aliphatic fused ring may include a fused ring obtained by Diels-Alder reaction. The photosensitive resin may include a ring having hetero atoms, for example, carbon atoms, hydrogen atoms, oxygen atoms, nitrogen atoms, sulfur atoms, etc. Examples of an aliphatic resin may include acrylate, cycloolefin, maleicanhydride, polymorbornene, etc.

In some embodiments according to the inventive concept, the resist composition may include a protecting group reacted with the incident light such as an ether type protecting group, an acetal type protecting group. An example of the ether type protecting group may include t-Butyloxycarbonyl group.

The resist composition according to example embodiment may include a photo reactive material for promoting and amplifying a photoreaction generated in the resist composition. The photo reactive material in the resist composition may include a photo acid generator (PAG) for the argon fluoride laser beam or the krypton fluoride laser beam. The chemical amplifier may generate an acid serving as a catalyst after the chemical amplifier may be hardened when light is irradiated to the chemical amplifier. An example of the chemical amplifier may include triphenylsulfonium-triflate (TPS-Tf).

In some embodiments according to the inventive concept, the first photoresist film 100 may be obtained using a positive type resist composition. The positive type resist composition may include a chemical amplifier which may generate triflic acid substantially stronger than sulfonic acid after receiving the incident light. An ether moiety (—O-protect) protected by an oxygen protector may be deprotected to form a—OH group by the triflic acid, so that a first photoresist pattern 110 (see FIG. 5A) may be formed on the anti-reflective layer 500 by increasing the solubility of the first photoresist film 100 with respect to the developing solution.

Referring to FIG. 3, the first photoresist film 100 may be formed by coating the photoresist composition on the anti-reflective layer 500 over the lower surface 1000. The resist composition may be a liquid or a dispersed solution. The first mask 800p having a predetermined pattern may be placed over the first photoresist film 100, and then the first photoresist film 100 may be exposed to light.

In some embodiments according to the inventive concept, the first mask 800p may have a positive type. For example, the first photoresist film 100 may be formed on the anti-reflective layer 500 by a spin coating process. In the spin coating process, the first photoresist film 100 having a thin thickness may be formed over the lower surface 1000 (a wafer or a substrate) by dispensing the resist composition on the anti-reflective layer 500 while rotating the wafer or the substrate on which the lower surface 1000 is disposed. The first photoresist film 100 may include a uniform mixture of a polymer and a photosensitive material. For example, the first photoresist film 100 may have a thickness of about several micrometers to about several tens micrometers based on the anti-reflective layer 500. However, the thickness of the first photoresist film 100 may vary in accordance with dimensions of the pattern formed on the lower surface 1000.

In some embodiments according to the inventive concept, a concentration of a solution including the resist composition may be adjusted to obtain the first photoresist film 100 having a desired thickness. For example, the solution including resist composition may have a relatively high concentration to form the first photoresist film 100 having a relatively large thickness. After forming the first photoresist film 100 on the anti-reflective layer 500, a remaining solvent on the first photoresist film 100 may be removed by increasing a temperature of the lower surface 1000 having the first photoresist film 100 thereon. Thus, a flow of the first photoresist film 100 may be protected and/or reduced, and also the quality of the first photoresist film 100 may be improved.

Figure 4A:
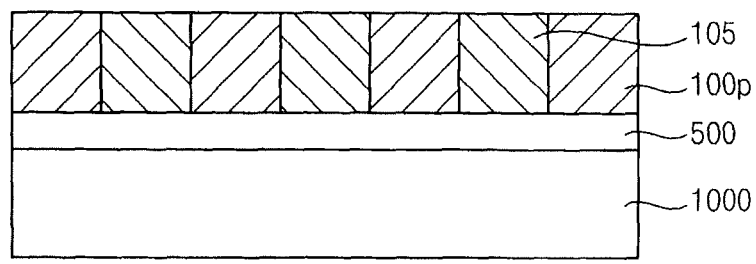
Figure 4B:
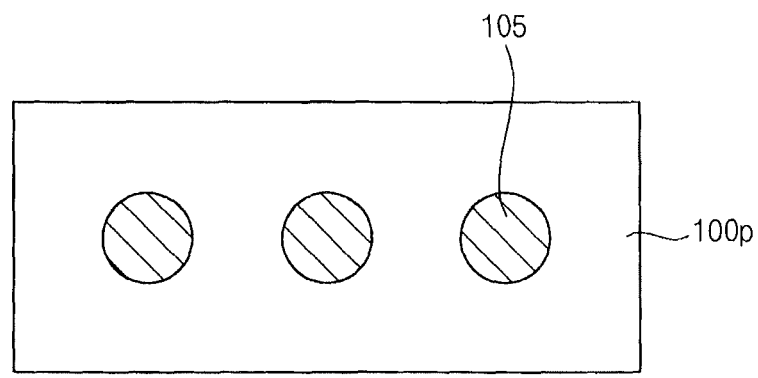
FIGS. 4B, 5B, 7B, 8B, 10B, 11B, 12B and 13B are plan views illustrating the method of forming the pattern of the lower surface by the photolithography process using positive type photoresist in some embodiments according to the inventive concept.

FIG. 4A is a cross-sectional view illustrating the first photoresist film 100 after an exposure process. FIG. 4B is a plan view illustrating the first photoresist film 100 after the exposure process.

Referring to FIGS. 4A and 4B, the first photoresist film 100 may have a first portion 105 and a preliminary first photoresist pattern 100p after exposure of the first photoresist film 100. The first portion 105 and the preliminary first photoresist pattern 100p may correspond to an exposed portion and an unexposed portion of the first photoresist film 100, respectively.

In some example embodiments, a temperature of the first photoresist film 100 may be increased during the exposure process and/or after the exposure process so as to promote a reaction of the resist composition and to ensure the reaction of the resist composition. The increase of the temperature of the first photoresist film 100 may correspond to a post exposure baking (PEB) process. In the PEB process, the transmutation of chemical characteristics of the resist composition caused by a photoreaction relative to light (e.g., g-line light, i-line light) may be effectively diffused, and also the activation energy for deprotecting generated acid (e.g., a KrF laser beam, an ArF laser beam) may be sufficiently provided to the resist composition. As a result, the first photoresist pattern 100p may have smoother edge portions.

In some embodiments according to the inventive concept, the photosensitive polymer may be included in the resist composition. To obtain the chemical reactions using different wavelengths, different chemical materials may be used in the photoresist composition. Thus, a photolithography system that emits light having different wavelengths may be used. For example, the light source may generate a light having a short wavelength to obtain a minute pattern. In case that the light source emits a KrF laser beam or an ArF laser beam, a chemically amplified resist may be included in the photoresist composition. Here, a photo acid generator (PAG) may be included in the photoresist composition having the chemical amplified resist so as to solve a problem such as a weak intensity of the light and to improve a productivity of the photolithography process. The PAG may have a relatively high acid generating efficiency. When the first photoresist film 100 is exposed to the light, the PAG may be decomposed to generate an acid that may unprotect an ether protector or an acetal protector. In this decomposition step, the acid may be used as a catalyst. When one decomposition step is finished, a new acid may be generated and used as a catalyst to repeatedly perform another decomposition step, so that the decomposition steps may be continuously carried out. A polymer in the first photoresist film 100 being decomposed a protector may generate the first portion 105 having a high solubility relative to a developing solution.

Figure 5A:
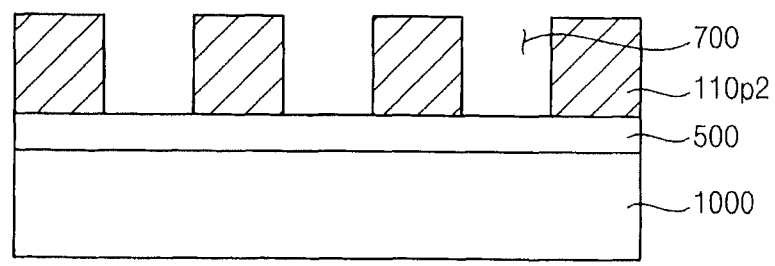
Figure 5B:
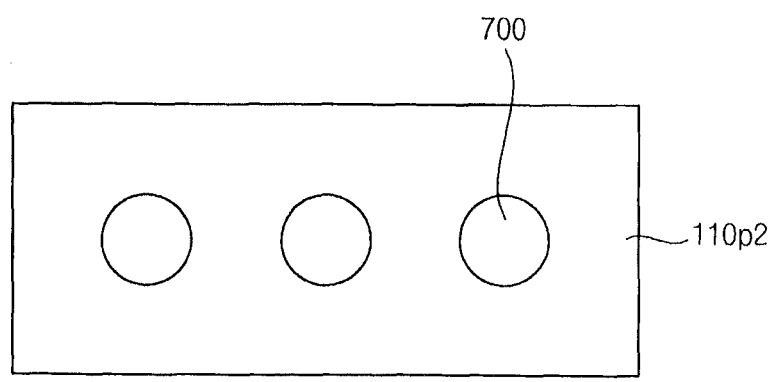

FIG. 5A is a cross-sectional view illustrating a process of forming the first photoresist pattern 110p2 by developing the first photoresist film 100. FIG. 5B is a plan view illustrating the process of forming the first photoresist pattern 110p2 by developing the first photoresist film 100.

Referring to FIGS. 5A and 5B, the first photoresist pattern 110p2 having a first opening 700 may be obtained by removing the first portion 105 of the first photoresist film 100 using the developing solution. That is, the first photoresist pattern 110p2 may be obtained from the preliminary first photoresist pattern 100p when the first portion 105 is removed from the first photoresist film 100. The first opening 700 in the first photoresist pattern 110p2 may correspond to a contact hole, a via hole, etc. The first opening 700 may expose a portion of an underlying layer. For example, a portion of the anti-reflective layer 500 may be exposed by the first opening 700 after removing the first portion 105 of the first photoresist film 100. Here, the first photoresist pattern 110p2 may have a resistance relative to the developing solution, so that the first photoresist pattern 110p2 may remain on the anti-reflective layer 500.

In some embodiments according to the inventive concept, the developing solution for removing the first portion 105 may include a base. For example, the developing solution may include a tetramethylamoniumhydride (TMAH) solution. Optionally, a temperature of the lower surface 1000 having the first pattern 110 may be raised to remove the developing solution during the developing step or after the developing step. In this case, the lower surface 1000 having the first pattern 110 may be thermally treated in a temperature of about 90° C. to about 150° C. However, the temperature of the lower surface 1000 may vary in accordance with process conditions of the photolithography process. When the lower surface 1000 has a relatively low temperature, a solvent may not be sufficiently removed from the first pattern 110. In case that the lower surface 1000 has a relatively high temperature, the solvent may be diffused to deteriorate a structure of the first pattern 110.

Figure 6:
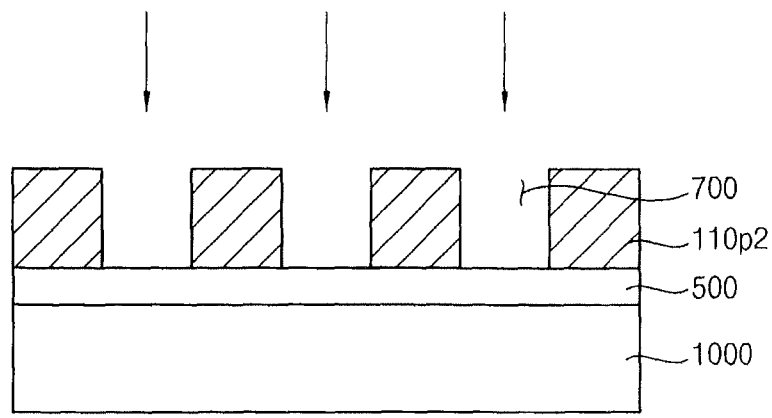

FIG. 6 is a cross-sectional view illustrating a plasma treatment relative to the first pattern 110 and the anti-reflective layer 500.

After performing the developing process described with reference to FIGS. 5A and 5B, a plasma treatment may be executed on the first photoresist pattern 110p2 and/or the anti-reflective layer 500 as illustrated in FIG. 6 using arrows. Hence, chemical and physical properties of the first photoresist pattern 110p2 and/or the anti-reflective layer 500 may be transmuted by the plasma treatment. In some embodiments according to the inventive concept, the plasma treatment may include a plasma process using a plasma generated from hydrogen halide gas such as an HBr gas, an HCl gas, etc. Alternatively, the plasma treatment may include a plasma process using a plasma generated from an inactive gas such as an Ar gas, an He gas, an Ne gas, an $N_2$ gas, etc.

Figure 7A:
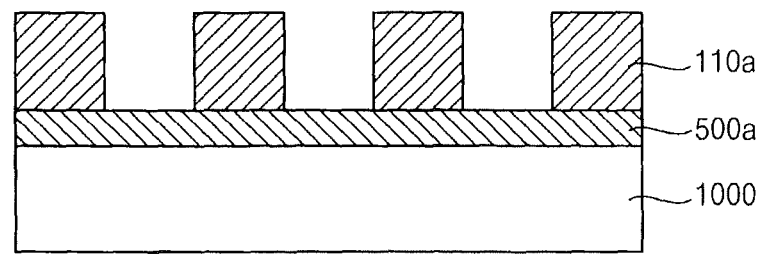
Figure 7B:
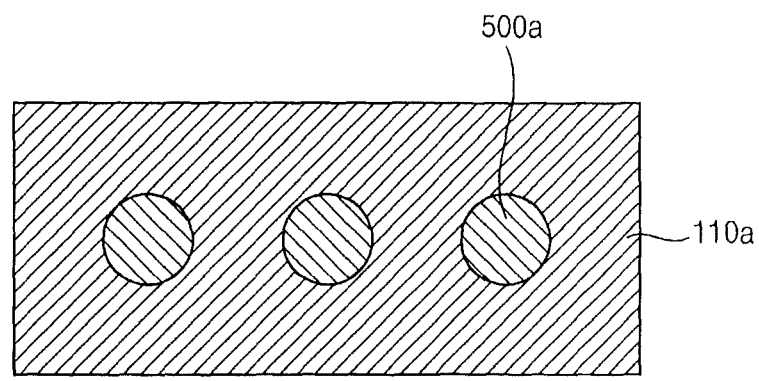

FIG. 7A is a cross-sectional view illustrating a transmuted first photoresist pattern 110a and a transmuted anti-reflective layer 500a after the plasma treatment. FIG. 7B is a plan view illustrating the transmuted first photoresist pattern 110a and the transmuted anti-reflective layer 500a after the plasma treatment.

Figure 27:
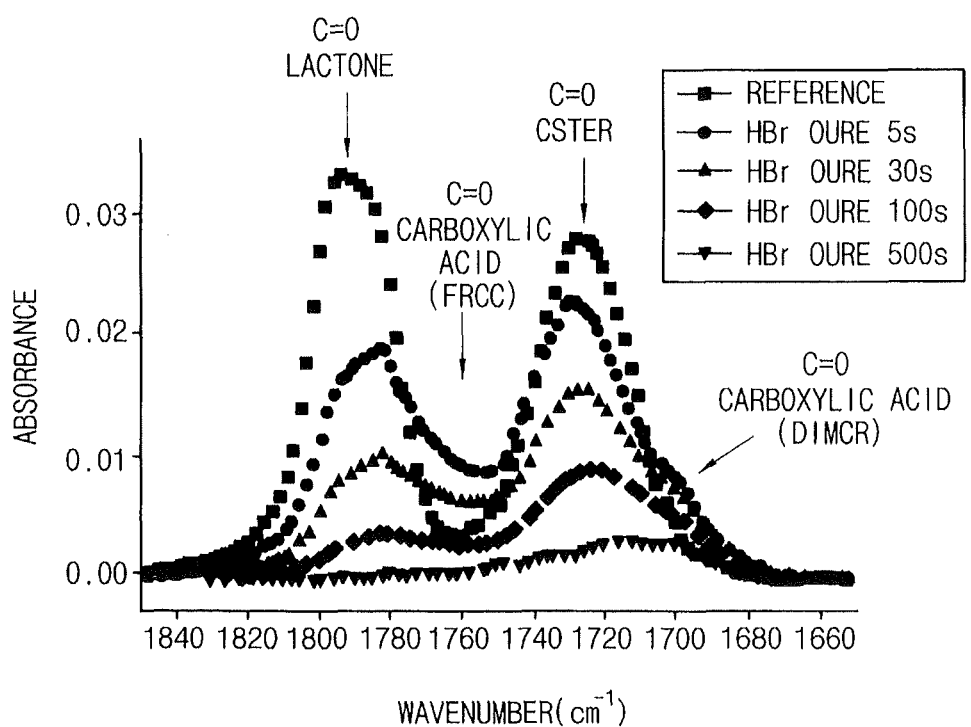
FIG. 27 is a graph illustrating contents of ingredients in a transmuted first photoresist pattern after a plasma treatment in some embodiments according to the inventive concept.

Referring to FIGS. 7A and 7B, the transmuted first photoresist pattern 110a and/or the transmuted anti-reflective layer 500a may be formed on the lower surface 1000 by the above-described plasma treatment. FIG. 27 is a graph illustrating ingredients in the transmuted first photoresist pattern 110a after the plasma treatment. In FIG. 27, the peaks of the ingredients in the transmuted first photoresist pattern 110a may be obtained using an infrared (IR) analysis apparatus.

In the transmuted first photoresist pattern 110a and the transmuted anti-reflective layer 500a, a peak of lactone (cyclicester) or a peak of ketone (CO) may be reduced after the plasma treatment as shown in FIG. 27. That is, properties of a photoresist pattern and an anti-reflective layer may be transmuted through the plasma treatment.

In some embodiments according to the inventive concept, the plasma treatment may be carried out for about 0.1 second to about 1,000 seconds. For example, the plasma treatment may be executed for about 1 second to about 700 seconds. In one example embodiment, the plasma treatment may be performed for about 5 seconds to about 500 seconds. However, a process time of the plasma treatment may vary in accordance with process conditions of the photolithography process and/or the dimensions of the first photoresist pattern 110 and the anti-reflective layer 500. The plasma treatment may be executed a plasma generated from a gas such as a hydrogen halide gas and/or an inactive gas. For example, the plasma may be generated from an HBr gas, an HCl gas, an Ar gas, an He gas, an Ne gas, an $N_2$ gas, etc. These may be used alone or in a combination thereof.

Figure 8A:
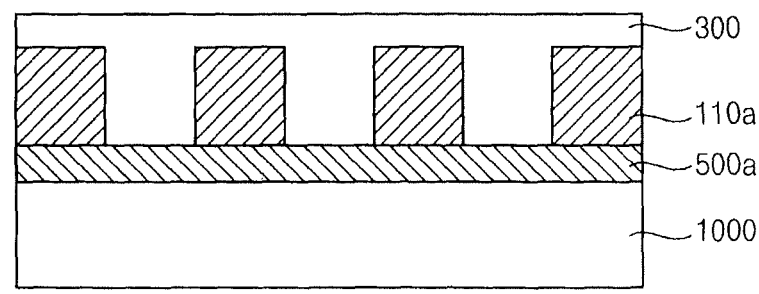
Figure 8B:
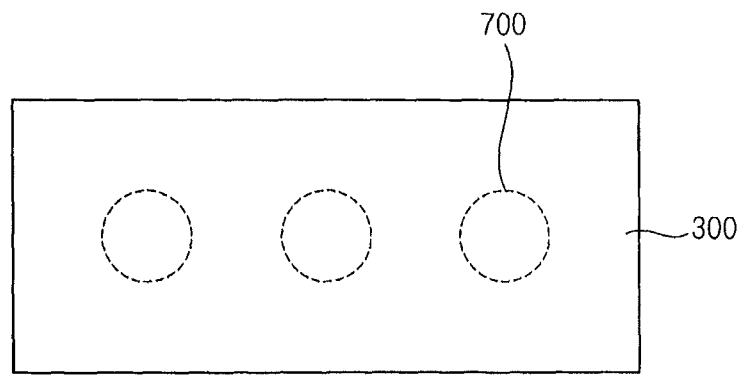

FIG. 8A is a cross-sectional view illustrating a process of forming a second photoresist film 300 on the transmuted first photoresist pattern 110a. FIG. 8B is a plan view illustrating the process of forming the second photoresist film 300 on the transmuted first photoresist pattern 110a.

Referring to FIGS. 8A and 8B, the second photoresist film 300 may be formed on the lower surface 1000 having the transmuted anti-reflective layer 500a to cover the transmuted first photoresist pattern 110a. The second photoresist film 300 may have a proper thickness to sufficiently fill the first opening 700 and extends on an upper surface of the transmuted first photoresist pattern 110a. That is, the first opening 700 may be completely filled with the second photoresist film 300.

In some embodiments according to the inventive concept, the second photoresist film 300 may include a photoresist composition substantially the same as or substantially similar to that of the first photoresist film 100. Alternatively, the second photoresist film 300 may include the photoresist composition different from that of the first photoresist film 100, so that the second photoresist film 300 may ensure good step coverage while completely filling the first opening 700. When the second photoresist film 300 may be coated under process conditions substantially the same as or substantially similar to those of the first photoresist film 100, the second photoresist film 300 may be substantially same as or substantially similar to the first photoresist film 100. In this case, a concentration of the photoresist composition in the second photoresist film 300 may be reduced to ensure complete filling of the first opening 700. Additionally, a thickness of the second photoresist film 300 from an upper face the transmuted first photoresist pattern 110a may be small so as to ensure sufficient transmission of light. For example, the second photoresist film 300 may have a thickness in a range of about 1 nm to about 100 nm based on the upper face the transmuted first photoresist pattern 110a.

In some example embodiments, the second photoresist film 300 may be thermally treated to increase a temperature of the second photoresist film 300 to effectively remove a solvent or a dissolvent from the second photoresist film 300 as similar to that of the first photoresist film 100.

Figure 9:
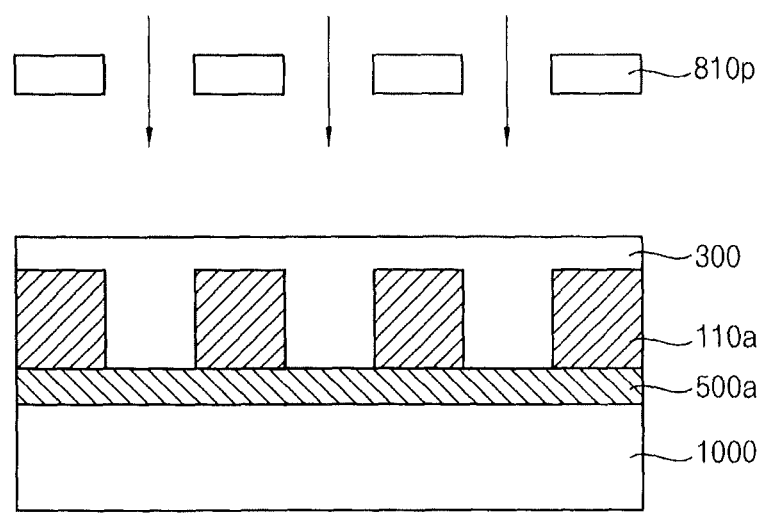

FIG. 9 is a cross-sectional view illustrating an exposure process performing about the second photoresist film 300.

Referring to FIG. 9, a second mask 810p may be placed over the second photoresist film 300, and then the second photoresist film 300 may be exposed to a light as indicated using arrows. In the exposure process for the second photoresist film 300, the second mask 810p for the second photoresist film 300 may have a construction substantially the same as or substantially similar to that of the first mask 800p for the first photoresist film 100. When the second mask 810p has the construction substantially the same as or substantially similar to that of the first mask 800p, the cost and the time of processes for forming the minute pattern of the lower surface 1000 may be reduced, and also the processes for forming the minute pattern 1000p may be simplified.

Figure 10A:
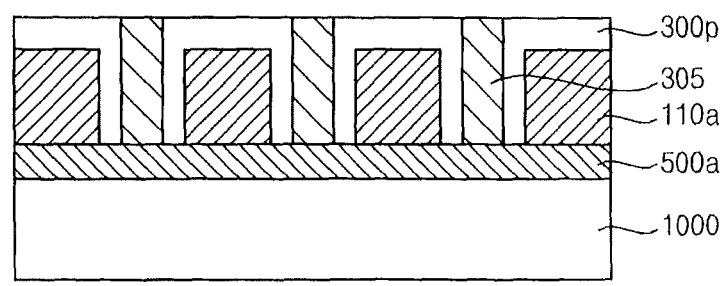

When the second photoresist film 300 is exposed using the second mask 810p having the construction substantially the same as or substantially similar to that of the first mask 800p, a portion of the second photoresist film 300 (a portion of a preliminary second photoresist pattern 300p; see FIG. 10A) exposed to the light may have properties changed by the light as similar to that of the first photoresist pattern 110, whereas an exposed portion (a second portion 305; see FIG. 10A) of the second photoresist film 300 may be different from the exposed portion of the first photoresist film 100. That is, the properties of the portion of the second photoresist pattern 300p immediately adjacent to, and in contact with, the side walls of the transmuted first photoresist pattern 110a (and the portions on the upper surface of the transmuted first photoresist pattern 110a) may not be changed during the exposure process for the second photoresist film 300. The second portion 305 may have a width substantially smaller than that of the second photoresist pattern 300p.

In some example embodiments, the second mask 810p may expose a portion of the second photoresist film 300 having a width relatively smaller than a portion of the first photoresist film 100 exposed by the first mask 800p. In this case, the portion of the preliminary second photoresist pattern 300p adjacent to the transmuted first photoresist pattern 110a may not be exposed to the light during the exposure process for the second photoresist film 300.

Figure 10B:
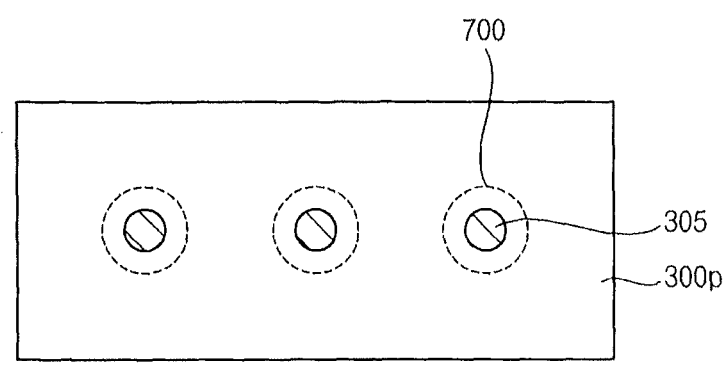

FIG. 10A is a cross-sectional view illustrating the second portion 305 and the preliminary second photoresist pattern 300p of the second photoresist film 300. FIG. 10B is a plan view illustrating the second portion 305 and the preliminary second photoresist pattern 300p of the second photoresist film 300.

Referring to FIGS. 10A and 10B, the second portion 305 of the second photoresist film 300 may have a width substantially smaller than that of the preliminary second photoresist pattern 300p. Further, the second portion 305 of the second photoresist film 300 may be substantially narrower than that of the first portion 105 of the first photoresist film 100. That is, the second portion 305 may have a fine dimension compared to that of the first portion 305.

Figure 11A:
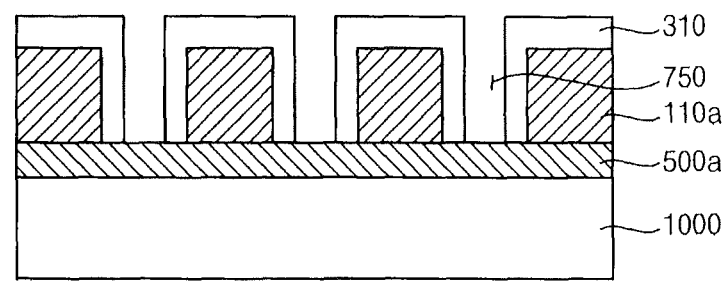
Figure 11B:
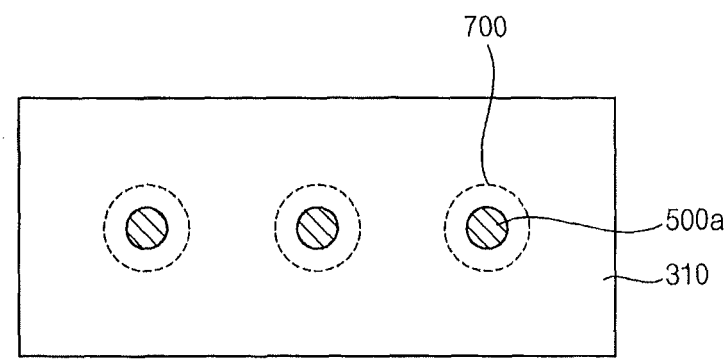

FIG. 11A is a cross-sectional view illustrating a second photoresist pattern 310 formed on the transmuted first photoresist pattern 110a. FIG. 11B is a plan view illustrating the second photoresist pattern 310 formed on the transmuted first photoresist pattern 110a.

As illustrated in FIGS. 11A and 11B, the second portion 305 may be removed from the transmuted anti-reflective layer 500a by performing a developing process about the second photoresist film 300. When the second portion 305 is removed, a second opening 750 may be provided between adjacent second photoresist patterns 310, and the second photoresist pattern 310 may cover a sidewall and an upper surface of the transmuted first photoresist pattern 110a. That is, the second photoresist pattern 310 may have a dimension substantially greater than that of the transmuted first photoresist pattern 110a. In some example embodiments, a temperature of the second photoresist film 300 may be selectively raised as described above.

Figure 12A:
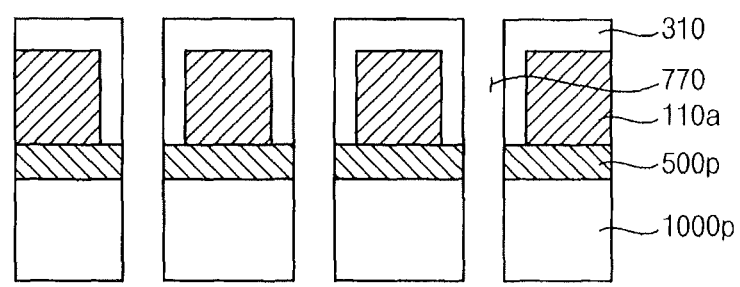
Figure 12B:
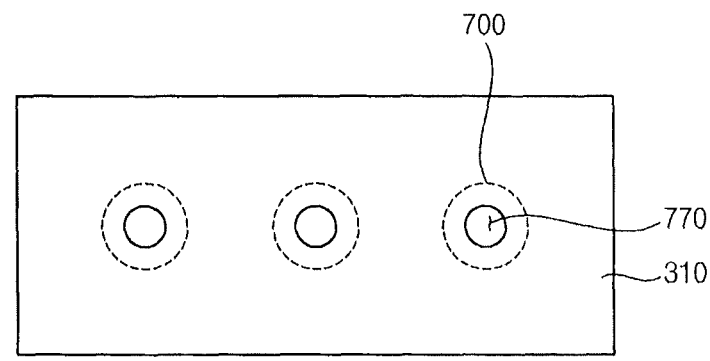

FIG. 12A is a cross-sectional view illustrating a process of forming the pattern 1000p on the lower surface 1000. FIG. 12B is a plan view illustrating the process of forming the pattern 1000p on the lower surface 1000.

Referring to FIGS. 12A and 12B, using the second pattern 310 and the transmuted first photoresist pattern 110a, the transmuted anti-reflective layer 500a and the lower surface 1000 may be etched, so that the pattern 1000p of the lower surface 1000 and an anti-reflective layer pattern 500p may be obtained. The pattern 1000p of the lower surface 1000 may have a minute dimension due to the combination of the transmuted first photoresist pattern 110a and the second photoresist pattern 310. Further, the pattern 1000p may include an opening 770 formed through the anti-reflective layer pattern 500p and the lower surface 1000.

According to example embodiments, the opening 770 of the pattern 1000p may have a dimension substantially smaller than that of the first opening 700. Further, the opening of the pattern 1000p may have a dimension substantially the same as or substantially similar to that of the second opening 750 of the second photoresist pattern 310. Thus, the pattern 770 may ensure not only a minute dimension but also a fine opening such as a minute contact hole, a minute via hole, etc.

Figure 13A:
Figure 13B:
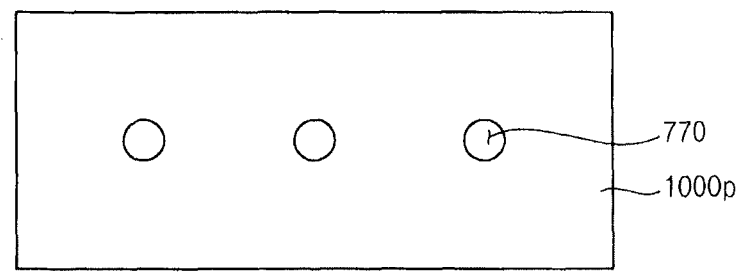

FIG. 13A is a cross-sectional view illustrating the pattern 1000p of the lower surface 1000 having the opening 770. FIG. 13B is a plan view illustrating the pattern 1000p of the lower surface 1000 having the opening 770.

As illustrated in FIGS. 13A and 13B, an ashing process and/or a stripping process may be performed to remove the second photoresist pattern 310, the transmuted first photoresist pattern 110a and the anti-reflective layer pattern 500p. Therefore, the pattern 1000p of the lower surface 1000 having the minute opening 770 may be obtained. For example, the opening 770 may have a width in a range of about 17 nm to about 50 nm.

According to example embodiments, a fine pattern having a minute dimension may be obtained although the fine pattern may be formed using a photolithography apparatus and a mask substantially the same as the conventional photolithography apparatus and the conventional mask. The fine pattern according to example embodiments may include a minute opening such as a contact hole, a via hole, etc. After forming a photoresist pattern and an anti-reflective layer, a plasma treatment of a photoresist pattern and/or an anti-reflective layer may be carried out to cause transmutation of properties of the photoresist pattern and/or the anti-reflective layer.

As described above with reference to FIG. 26, the intensity of the reflected light from the lower surface may be reduced because destructive interference may occur between the reflected light from the lower surface through the anti-reflective layer and the reflected light from the anti-reflective layer through the photoresist pattern. However, when the plasma treatment is performed on the photoresist pattern and/or the anti-reflective layer, the photoresist pattern and/or the anti-reflective layer may be partially or totally transmuted to thereby change the degree of the interference between the two reflected lights. For example, the absorbance and the refraction coefficient of the photoresist pattern and/or the anti-reflective layer may be changed by the plasma treatment.

When an additional photoresist pattern having an additional opening may be formed on a transmuted photoresist pattern having an opening substantially smaller the additional opening, a light may not sufficiently reach an inside of the additional opening because the additional opening has a dimension substantially smaller than that of the opening. According to example embodiment, the reflected light may be sufficiently provided into the additional opening because of the transmuted photoresist pattern and/or a transmuted anti-reflective layer by the plasma treatment. Thus, the additional photoresist pattern may ensure a desired dimension as well as the additional opening may accurately have a minute dimension.

Figure 28:
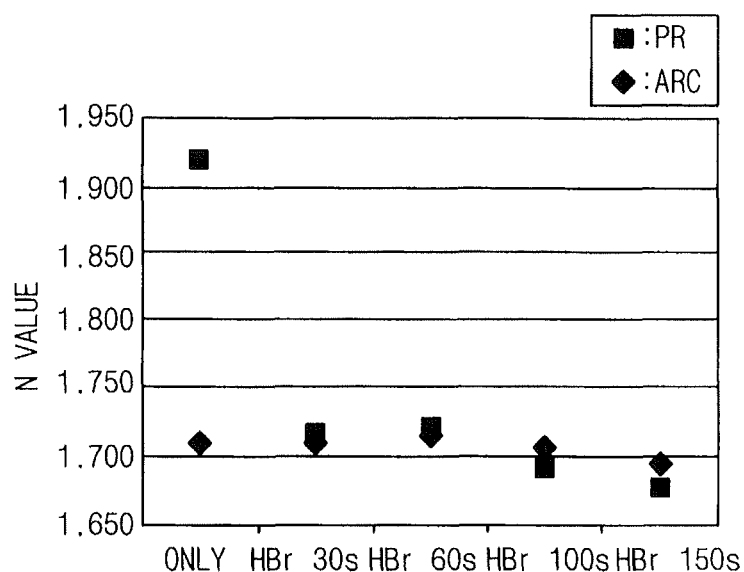
FIG. 28 is a graph illustrating variations of refraction coefficients (N values) of a photoresist layer (PR) and an anti-reflective layer (ARC) in some embodiments according to the inventive concept.

FIG. 28 is a graph illustrating variations of refraction coefficients (N values) of a photoresist layer (PR) and an anti-reflective layer (ARC) according to example embodiments. In FIG. 28, "■" represents the variation of N values of the photoresist film (PR), and "◆" indicates the variation of N values of the anti-reflective layer (ARC).

Referring to FIG. 28, the N values of the photoresist film (PR) and the anti-reflective layer (ARC) are considerably changed after a plasma treatment. That is, the N values of the photoresist film are greatly reduced by the plasma treatment using a plasma generated from an HBr gas. Because the properties of the photoresist film (PR) and the anti-reflective layer (ARC) are changed by the plasma treatment, the intensity of the light reflected through the photoresist film (PR) and/or the anti-reflective layer (ARC) may be desirably adjusted. For example, the intensity of the light may be controlled by changing the lubricity and the interference of the photoresist film (PR) and the anti-reflective layer (ARC).

Figure 29:
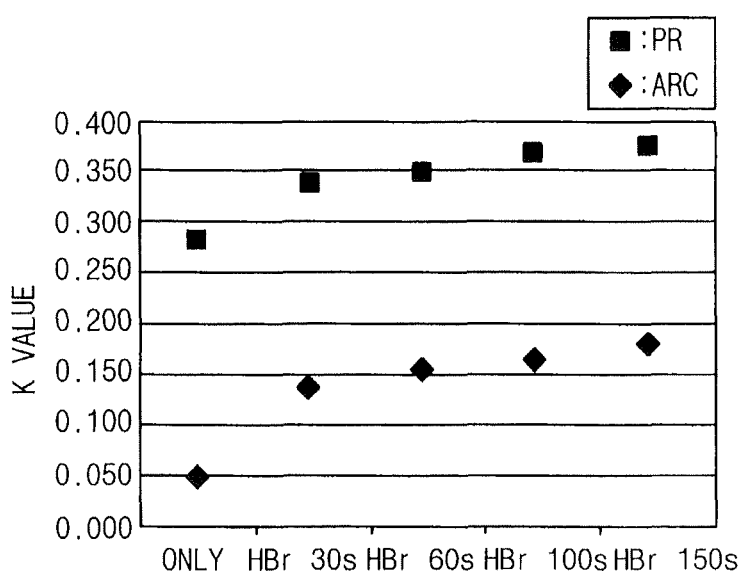
FIG. 29 is a graph illustrating variations of absorbances (K values) of a photoresist layer (PR) and an anti-reflective layer (ARC) in some embodiments according to the inventive concept.

FIG. 29 is a graph illustrating variations of absorbances (K values) of a photoresist layer (PR) and an anti-reflective layer (ARC) according to example embodiments. In FIG. 29, "■" represents the variation of K values of the photoresist film (PR), and "◆" indicates the variation of K values of the anti-reflective layer (ARC).

As shown in FIG. 29, each of the photoresist film (PR) and the anti-reflective layer (ARC) has a relatively low K values corresponding to a relatively high reflectivity before a plasma treatment. However, the K values of the photoresist film (PR) and the anti-reflective layer (ARC) gradually increase after the plasma treatment using a plasma generated from an HBr gas. That is, when the plasma treatment is performed on the photoresist film (PR) and the anti-reflective layer (ARC), each of the photoresist film (PR) and the anti-reflective layer (ARC) may have a relatively high absorbance and a relatively low reflectivity.

Figure 30:
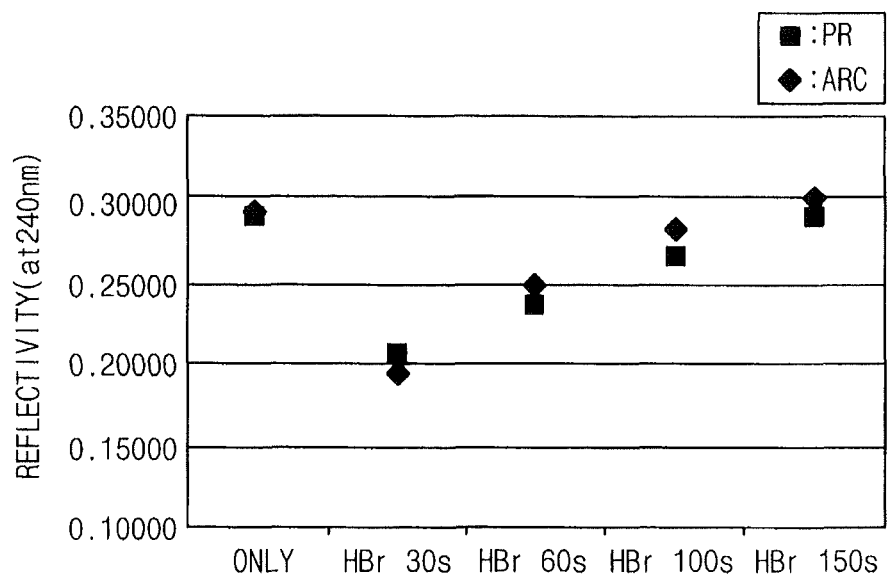
FIG. 30 is a graph illustrating reflectivity variations of a photoresist film (PR) and an anti-reflective layer (ARC) in some embodiments according to the inventive concept.

FIG. 30 is a graph illustrating reflectivity variations of a photoresist film (PR) and an anti-reflective layer (ARC) according to example embodiments. In FIG. 30, "■" represents the variation of reflectivities of the photoresist film (PR), and "◆" indicates the variation of reflectivities of the anti-reflective layer (ARC). The reflectivities of the photoresist film (PR) and the anti-reflective layer (ARC) were measured by varying the process time of plasma treatment after forming the photoresist film (PR) and the anti-reflective layer (ARC) on a lower surface.

Referring to FIG. 30, after performing the plasma treatment on the photoresist film (PR) and the anti-reflective layer (ARC), each of the photoresist film (PR) and the anti-reflective layer (ARC) has a reflectivity lower than that of the photoresist film (PR) and the anti-reflective layer (ARC) before the plasma treatment. In the case that the photoresist film (PR) and the anti-reflective layer (ARC) have relatively low reflectivities, the intensity of the light reflected from the photoresist film (PR) and/or the anti-reflective layer (ARC) may be reduced. When the photoresist film (PR) and the anti-reflective layer (ARC) are treated with a plasma generated form an HBr gas for about 150 seconds, the photoresist film (PR) and the anti-reflective layer (ARC) may have reflectivities substantially similar to those of the photoresist film (PR) and the anti-reflective layer (ARC) before the plasma treatment. Thus, the plasma treatment may be carried for about 150 seconds to ensure proper reflectivities of the photoresist film (PR) and the anti-reflective layer (ARC).

Figure 31:
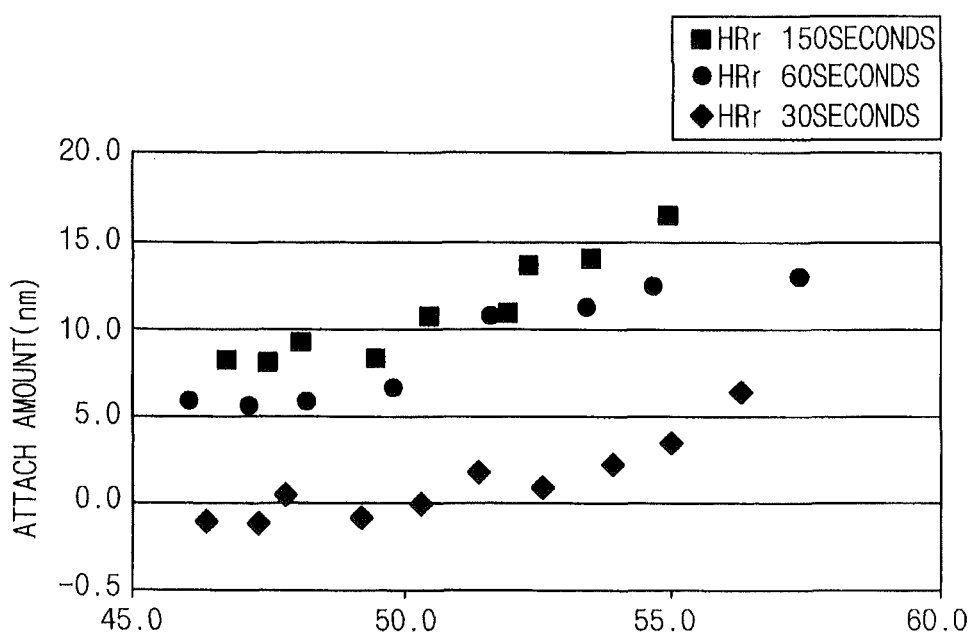
FIG. 31 is a graph illustrating thicknesses of additional photoresist patterns relative to a plasma treatment in some embodiments according to the inventive concept.

FIG. 31 is a graph illustrating thickness variation of additional photoresist patterns relative to a plasma treatment according to example embodiments.

The following Table indicates the measured thicknesses of the additional photoresist patterns with respect to the process time of the plasma treatment.

TABLE

| | process time of plasma treatment | | |
|---|---|---|---|
| | 30 seconds | 60 seconds | 150 seconds |
| cross-sectional thickness of additional photoresist pattern | 10.6 nm | 6.5 nm | 0.0 nm |

Referring to FIG. 31 and the above Table, when the plasma treatment is executed for about 30 seconds, the additional photoresist pattern has the largest cross-sectional thickness although variations of reflectivity and refraction coefficient are large. This means the additional photoresist pattern may sufficiently remain on an underlying photoresist pattern, so that an opening between adjacent additional photoresist patterns may have a minute dimension.

Figure 32:
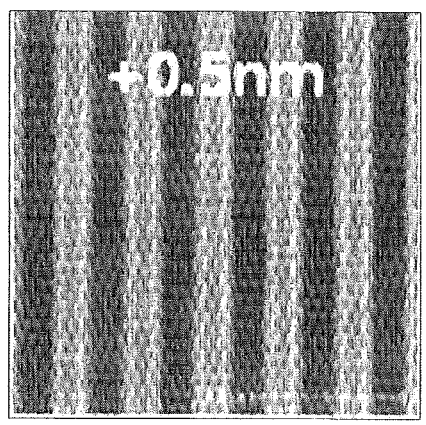
FIG. 32 and FIG. 33 are electron microscopic pictures showing first photoresist patterns and second photoresist patterns, respectively, in some embodiments according to the inventive concept.
Figure 33:
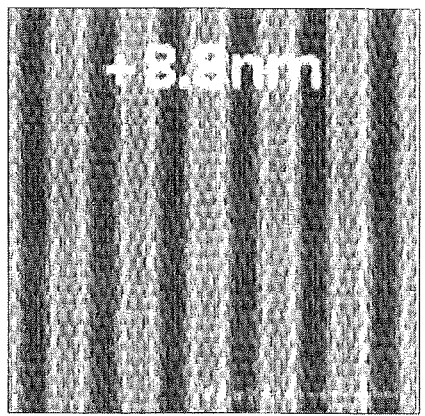

FIG. 32 and FIG. 33 are electron microscopic pictures showing first photoresist patterns and second photoresist patterns in some embodiments according to according to the inventive concept. In FIGS. 32 and 33, each of the first and the second photoresist pattern is formed to have a line shape or a bar shape.

As shown in FIGS. 32 and 33, a distance between adjacent second photoresist patterns is smaller than a distance between adjacent first photoresist patterns, so that a photoresist pattern structure having a minute dimension may be obtained by forming the second photoresist pattern on the first photoresist pattern. For example, the distance between adjacent second photoresist patterns is less than a distance between adjacent first photoresist patterns by about 3 nm to about 15 nm.

In some embodiments according to according to the inventive concept, a third photoresist pattern may be additionally formed on the second photoresist pattern over the first photoresist pattern. The third photoresist pattern may be obtained by processes substantially the same as or substantially similar to the processes described with reference to FIGS. 3 to 11B. In this case, an additional opening between adjacent third photoresist patterns may have a dimension substantially less than that of an opening between adjacent second photoresist patterns. Therefore, a photoresist pattern structure including the first to the third photoresist patterns may provide a dimension that is suitable for a fine pattern of a lower surface.

Hereinafter, there will be described a method of forming a pattern of a lower surface by a photolithography process using negative type photoresist with reference to the accompanying drawings.

FIGS. 14, 15, 16A, 17A, 18, 19A, 20A, 21, 22A, 23A, 24A and 25A are cross sectional views illustrating methods of forming a pattern from a lower surface by a photolithography process using negative type photoresist in accordance with example embodiments. FIGS. 16B, 17B, 19B, 20B, 22B, 23B, 24B and 25B are plan views illustrating methods of forming the pattern from the lower surface by the photolithography process using negative type photoresist in some embodiments according to according to the inventive concept. The methods illustrated in FIGS. 14 to 25B may be substantially similar to the methods described with reference to FIGS. 2 to 13B except for photoresist films.

Figure 14:
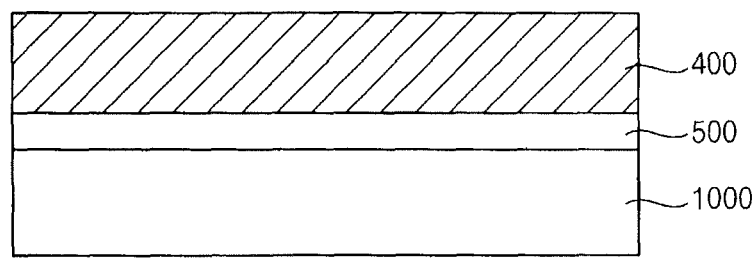
FIGS. 14, 15, 16A, 17A, 18, 19A, 20A, 21, 22A, 23A, 24A and 25A are cross sectional views illustrating a method of forming a pattern of a lower surface by a photolithography process using negative type photoresist in some embodiments according to the inventive concept.

FIG. 14 is a cross-sectional view illustrating processes of forming an anti-reflective layer 500 and a first photoresist film 400 on a lower surface.

Referring to FIG. 14, the anti-reflective layer 500 and the first photoresist film 400 may be formed on the lower surface 1000. The first photoresist film 400 may be formed using negative photoresist. Thus, a portion of the first photoresist film 400 may be hardened when a light is irradiated onto the portion of the first photoresist film 400. The anti-reflective layer 500 and the lower surface 1000 may be formed by processes substantially the same as or substantially similar to those described with reference to FIG. 2.

Figure 15:
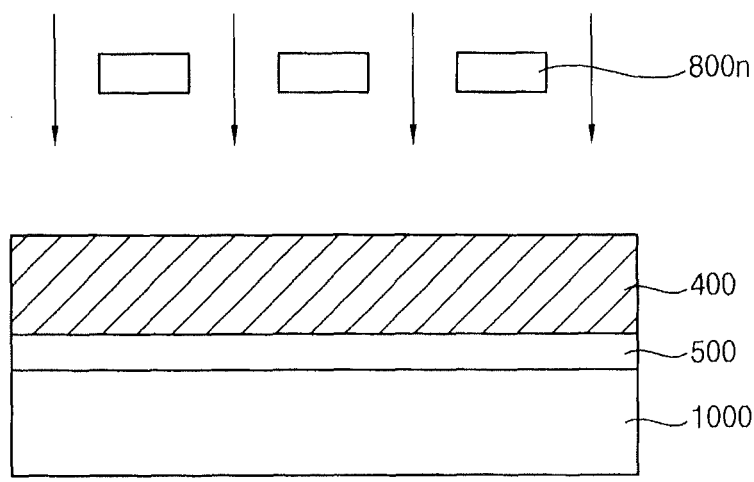

FIG. 15 is a cross-sectional view illustrating an exposure process of the first photoresist film 400.

Referring to FIG. 15, a first mask 800n is placed over the first photoresist film 400, and then the first photoresist film 400 is exposed to light indicated as arrows. The exposure process for the first photoresist film 400 may be substantially the same as or substantially similar to the exposure process described with reference to FIG. 3 except for the type of photoresist of the first photoresist film 400.

Figure 16A:
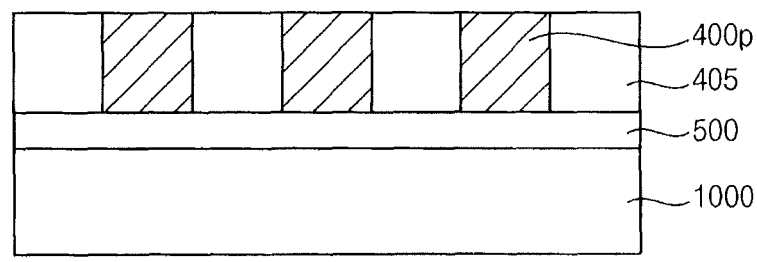
Figure 16B:
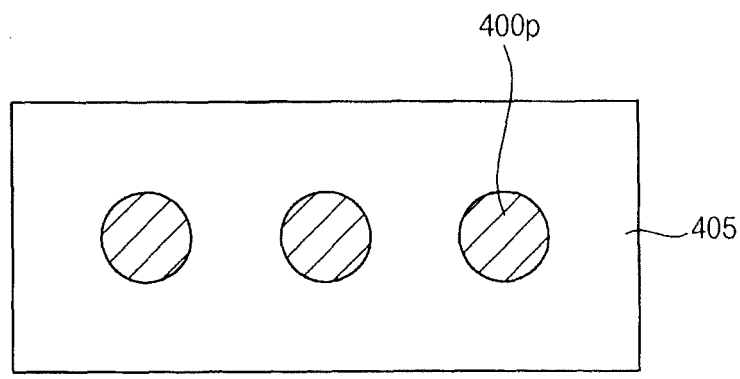
FIGS. 16B, 17B, 19B, 20B, 22B, 23B, 24B and 25B are plan views illustrating the method of forming the pattern of the lower surface by the photolithography process using negative type photoresist in some embodiments according to the inventive concept.

FIG. 16A is a cross-sectional view illustrating a first portion 400p and a first photoresist pattern 405 of the first photoresist film 400. FIG. 16B is a plan view illustrating the first portion 400p and the first photoresist pattern 405 of the first photoresist film 400.

Referring to FIGS. 16A and 16B, after exposing the first photoresist film 400, the first photoresist film 400 may be divided into the first portion 400p and the first photoresist pattern 405. Because the first photoresist film 400 includes negative photoresist, the first portion 400p exposed to the light may be hardened by changing properties of the first portion 400p.

Figure 17A:
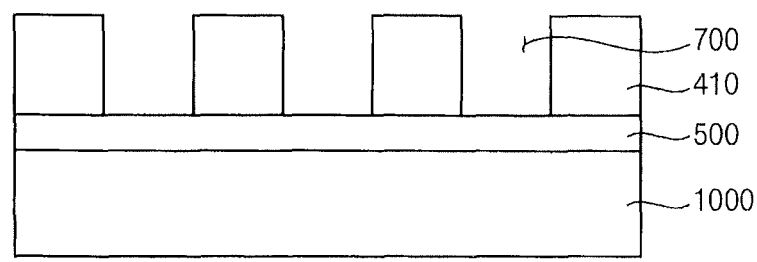
Figure 17B:
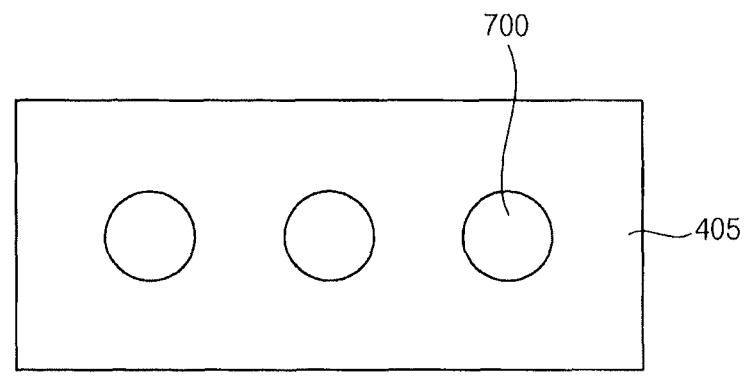

FIG. 17A is a cross-sectional view illustrating the first photoresist pattern 410 of the first photoresist film 400. FIG. 17B is a plan view illustrating the first photoresist pattern 410 of the first photoresist film 400.

Referring to FIGS. 17A and 17B, a developing process may be performed on the first photoresist film 400 having the first portion 400p and the first photoresist pattern 405, the first portion 400p may be removed from the anti-reflective layer 500 and the first photoresist pattern 410 may remain on the anti-reflective layer 500. Hence, a first opening 700 may be provided between adjacent first photoresist patterns 410. The first opening 700 may partially expose the anti-reflective layer 500. In some embodiments according to according to the inventive concept, the lower surface 1000 having the first photoresist pattern 410 may be thermally treated.

Figure 18:
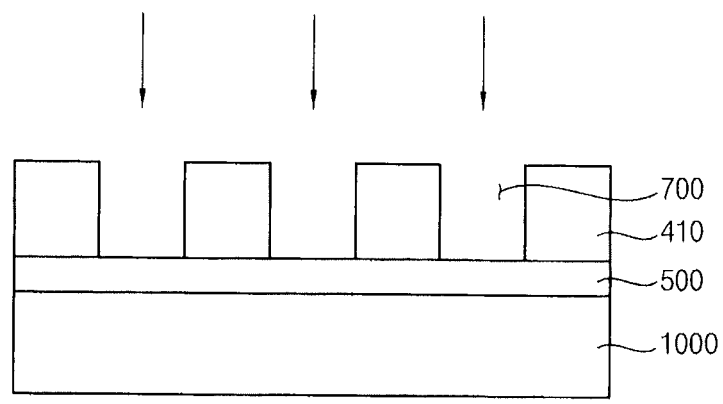

FIG. 18 is a cross-sectional view illustrating a plasma treatment of the first photoresist pattern 410 and/or the anti-reflective layer 500.

Referring to FIG. 18, at least one of the first photoresist pattern 410 and the anti-reflective layer 500 may be transmuted by the plasma treatment indicated using arrows. That is, properties of the first photoresist pattern 410 and/or the anti-reflective layer 500 may be changed by the plasma treatment. The plasma treatment may be carried out using a plasma generated from a hydrogen halide gas, an inactive gas, etc.

Figure 19A:
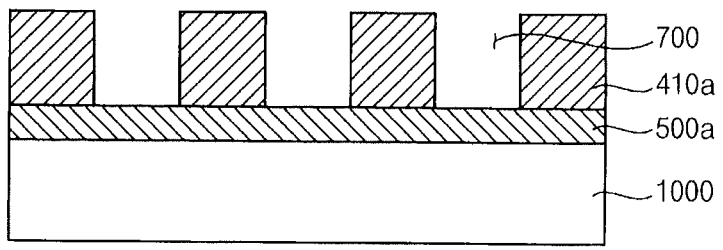
Figure 19B:
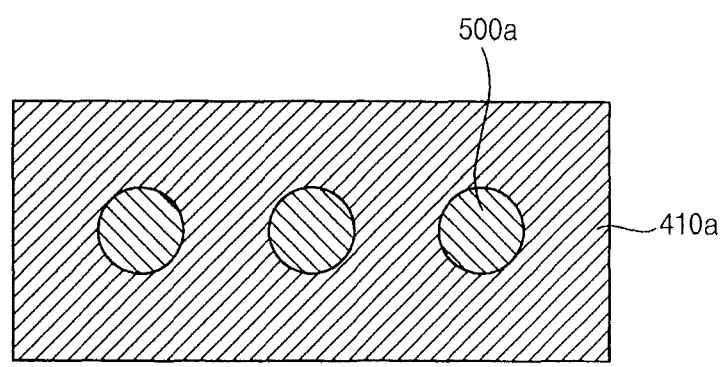

FIG. 19A is a cross-sectional view illustrating a transmuted first photoresist pattern 410a and a transmuted anti-reflective layer 500a. FIG. 19B is a plan view illustrating the transmuted first photoresist pattern 410a and the transmuted anti-reflective layer 500a.

Referring to FIGS. 19A and 19B, the transmuted first photoresist pattern 410a and/or the transmuted anti-reflective layer 500a may be provided on the lower surface 1000 after performing the plasma treatment about the first photoresist pattern 410 and/or the anti-reflective layer 500. The plasma treatment for forming the transmuted first photoresist pattern 410a and/or the transmuted anti-reflective layer 500a may be substantially the same as or substantially similar to that described with reference FIG. 6.

Figure 20A:
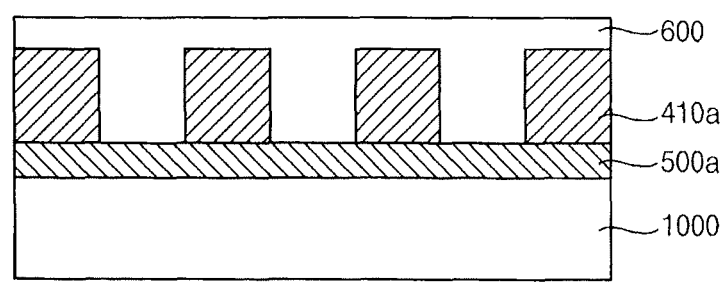
Figure 20B:
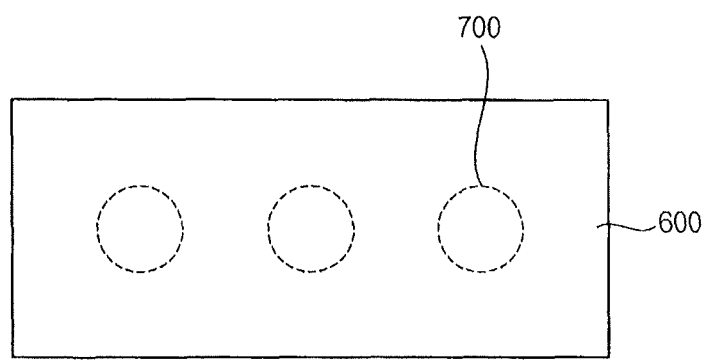

FIG. 20A is a cross-sectional view illustrating a process of forming a second photoresist film 600. FIG. 20B is a plan view illustrating the process of forming the second photoresist film 600.

Referring to FIGS. 20A and 20B, the second photoresist film 600 may be formed on the transmuted first photoresist pattern 410a and the transmuted anti-reflective layer 500a to fill up the first opening 700. The second photoresist film 600 may sufficiently fill the first opening 700. The second photoresist film 600 may have a thickness substantially larger than a height of the transmuted first photoresist pattern 410a for a subsequent exposure process of the second photoresist film 600. For example, the second photoresist film 600 may protrude over the transmuted first photoresist pattern 410a by about several micrometers to about scores of micrometers.

Figure 21:
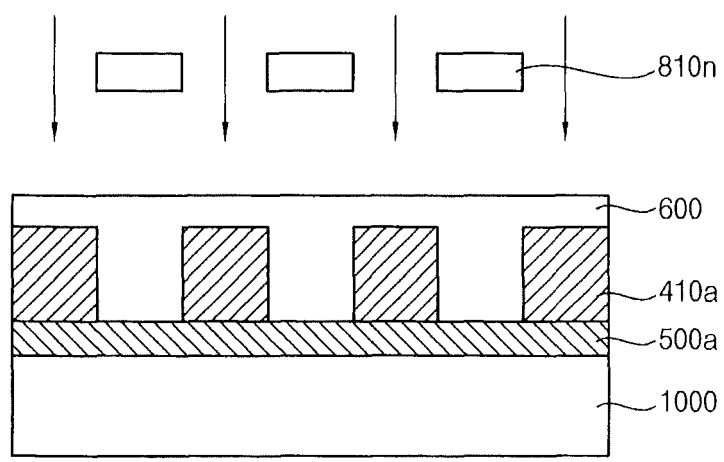

FIG. 21 is a cross-sectional view illustrating an exposure process for the second photoresist film 600.

Referring to FIG. 21, after providing a second mask 810n over the second photoresist film 600, the second photoresist film 600 may be exposed to light as indicated using arrows. The exposure process of the second photoresist film 600 may be substantially the same as or substantially similar to that described with reference to FIG. 9.

Figure 22A:
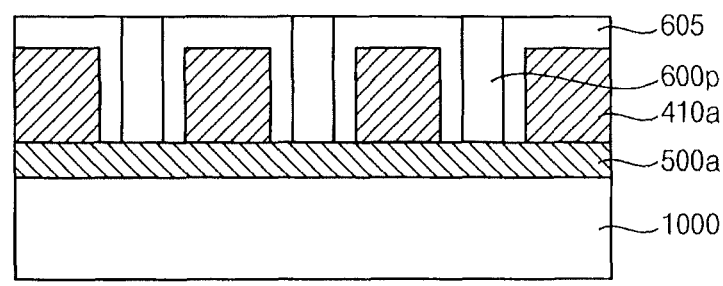
Figure 22B:
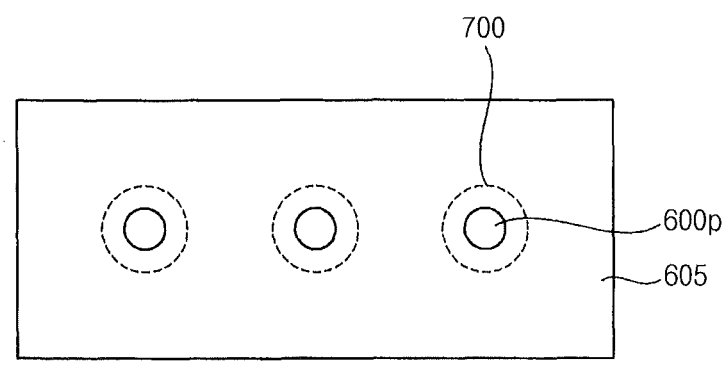

FIG. 22A is a cross-sectional view illustrating a second portion 600p and a preliminary second photoresist pattern 605 of the second photoresist film 600. FIG. 22B is a plan view illustrating the second portion 600p and the preliminary second photoresist pattern 605 of the second photoresist film 600.

Referring to FIGS. 22A and 22B, after exposing the second photoresist film 600, the second photoresist film 600 may be divided into the second portion 600p and the preliminary second photoresist pattern 605. The second portion 600p and the preliminary second photoresist pattern 605 may correspond to an exposed portion and an unexposed portion, respectively. The preliminary second photoresist pattern 605 may cover a sidewall and an upper portion of the transmuted first photoresist pattern 410a because of the transmuted first photoresist pattern 410a and/or the transmuted anti-reflective layer 500a. That is, the preliminary second photoresist pattern 605 may have a dimension substantially greater than that of the transmuted first photoresist pattern 410a.

Figure 23A:
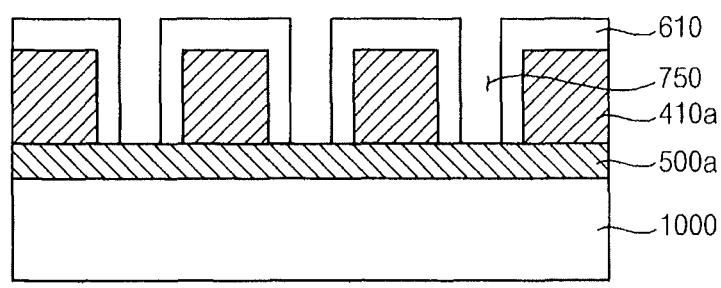
Figure 23B:
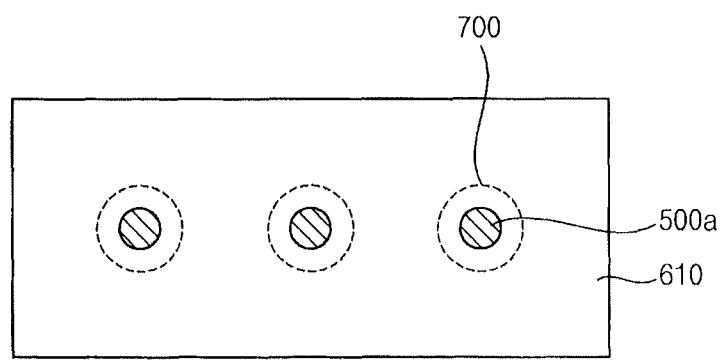

FIG. 23A is a cross-sectional view illustrating a second photoresist pattern 610 covering the transmuted first photoresist pattern 401a. FIG. 23B is a plan view illustrating the second photoresist pattern 610 covering the transmuted first photoresist pattern 401a.

Referring to FIGS. 23A and 23B, the second portion 600p of the second photoresist pattern 600 may be removed from the transmuted anti-reflective layer 500a, so that a second photoresist pattern 610 may be formed on the transmuted first photoresist pattern 410a and the transmuted anti-reflective layer 500a. When the second portion 600p is removed, a second opening 750 may be provided between adjacent features of the second photoresist pattern 610. The second opening 750 may be substantially smaller than that of the first opening 700 because the second photoresist pattern 610 remains on the sidewall of the transmuted first photoresist pattern 410a.

Figure 24A:
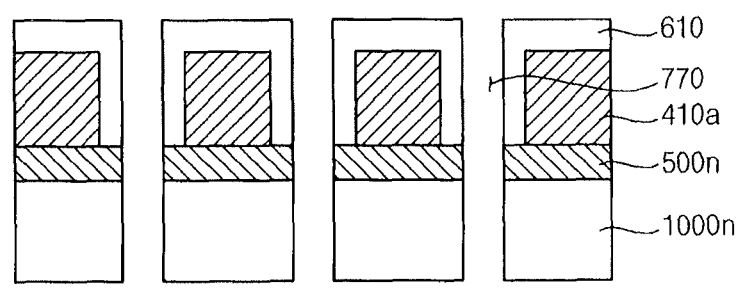
Figure 24B:
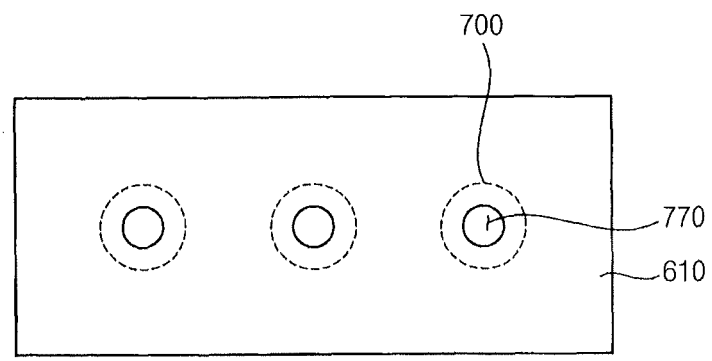

FIG. 24A is a cross-sectional view illustrating a process of forming a preliminary pattern 1000n of the lower surface 1000. FIG. 24B is a plan view illustrating the process of forming the preliminary pattern 1000n of the lower surface 1000.

Referring to FIGS. 24A and 24B, the transmuted anti-reflective layer 500a and the lower surface 1000 may be partially etched using the second photoresist pattern 610 and the transmuted first photoresist pattern 410 as etching masks. Hence, an anti-reflective layer pattern 500a and the preliminary pattern 1000n of the lower surface 1000 may be obtained. The anti-reflective layer pattern 500a and the preliminary pattern 1000n of the lower surface 1000 may include an opening 770 caused from the second opening 750. For example, the opening 770 of the preliminary pattern 1000n may have a contact shape, a via hole shape, etc. The opening 770 of the preliminary pattern 1000n may have a dimension substantially similar to that of the second opening 750. For example, the opening 770 of the preliminary pattern 1000n may have a width in a range of about 17 nm to about 50 nm.

Figure 25A:
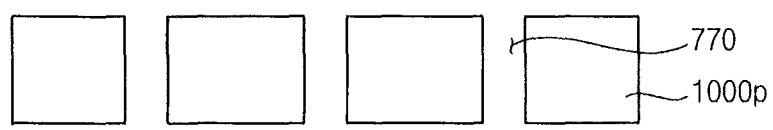
Figure 25B:
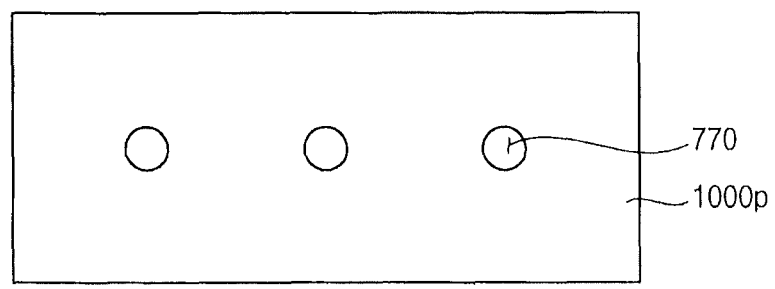

FIG. 25A is a cross-sectional view illustrating a pattern 1000p of the lower surface 1000. FIG. 25B is a plan view illustrating the pattern 1000p of the lower surface 1000.

Referring to FIGS. 25A and 25B, the pattern 1000p of the lower surface 1000 may be obtained by removing the second photoresist pattern 610, the transmuted first photoresist pattern 410a and the anti-reflective layer pattern 500n. The second photoresist pattern 610, the transmuted first photoresist pattern 410a and the anti-reflective layer pattern 500n may be removed by an ashing process and/or a stripping process. The pattern 1000p of the lower surface 1000 may include the minute opening 770 having a high aspect ratio.

According to example embodiments, a fine pattern having a minute opening may be obtained using positive photoresist or negative photoresist. The minute opening of the fine pattern may ensure a considerably small dimension and a relatively high aspect ratio.

After performing a plasma treatment on a photoresist pattern formed on an anti-reflective layer, the transmutation of the photoresist pattern was measured using an infrared spectroscopy. The photoresist pattern was formed using a photoresist composition (TARF-6A-813PH) manufactured by TOK company and the anti-reflective layer was formed using NCHA4117 manufactured by Nissan Chemical Company.

In FIG. 27, an x-axis indicates a wavelength of absorbed infrared light and a y-axis denotes an absorbance of ingredients in the photoresist pattern. As shown in FIG. 27, keton in the photoresist pattern had a peak of wave number at about $1{,}720\ cm^{-1}$, and lacton in the photoresist pattern had a peak of wave number at about $1{,}800\ cm^{-1}$. As the photoresist pattern was treated with a plasma generated from an HBr gas, the peaks of wave numbers of keton and lacton were gradually reduced to cause the transmutation of the photoresist pattern.

Referring to FIG. 28 to FIG. 30, the anti-reflective layer had a greatly decreased N value when the anti-reflective layer was treated with the plasma generated from the HBr gas as described above. Further, the reflectivities of the anti-reflective layer and the photoresist pattern were reduced as the plasma treatment using the plasma generated from the HBr gas, whereas the reflectivities of the anti-reflective layer and the photoresist pattern were substantially similar to those of the anti-reflective layer and the photoresist pattern before the plasma treatment. As shown in FIG. 31, when the photoresist pattern was treated with the plasma generated from the HBr gas for about 30 seconds and about 60 seconds, an additional photoresist pattern was properly formed on the photoresist pattern although the additional photoresist pattern was formed using a mask having a dimension substantially similar to that of the conventional mask.

According to example embodiments, a fine pattern having a minute opening for a highly integrated semiconductor device may be easily obtained without changing constructions of a mask and a photolithography apparatus. Further, the fine pattern may be simplified obtained more than two photolithography processes using substantially identical masks. Thus, the cost and time for manufacturing the semiconductor device having the fine pattern may be reduced, and the throughput of the semiconductor device may be improved.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device using a photolithography process, comprising:
    forming an anti-reflective layer and a first photoresist film on a lower surface;
    exposing the first photoresist film to light;
    forming a first photoresist pattern having a first opening by developing the first photoresist film;
    performing a plasma treatment on the first photoresist pattern;
    forming a second photoresist film on the first photoresist pattern;
    exposing the second photoresist film to light; and
    forming a second photoresist pattern having a second opening by developing the second photoresist film, wherein the second opening is narrower than the first opening.

2. The method of claim 1, further comprising:
    performing a first soft baking process on the first photoresist film; and
    performing a second soft baking process on the second photoresist film.

3. The method of claim 2, further comprising:
    performing a first hard baking process on the first photoresist film; and
    performing a second hard baking process on the second photoresist film.

4. The method of claim 1, further comprising:
    performing a first baking process on the first photoresist film after exposing the first photoresist film; and
    performing a second baking process on the second photoresist film after exposing the second photoresist film.

5. The method of claim 1, wherein performing the plasma treatment comprises performing the plasma treatment using a plasma generated from at least one selected from the group consisting of a hydrogen bromide (HBr) gas, a hydrogen chloride (HCl) gas, a helium (He) gas, a neon (Ne) gas, a nitrogen (N2) gas and an argon (Ar) gas.

6. The method of claim 1, wherein performing the plasma treatment comprises performing the plasma treatment for about 1 second to about 300 seconds.

7. The method of claim 1, wherein each of the first photoresist film and the second photoresist film comprises a positive type photoresist.

8. The method of claim 1, wherein each of the first photoresist film and the second photoresist film is exposed to argon fluoride (ArF) laser light.

9. The method of claim 1, wherein each of the first photoresist film and the second photoresist film is exposed using an immersion photolithography apparatus.

10. The method of claim 1, wherein forming the second photoresist pattern comprises forming the second photoresist pattern contacting a sidewall of the first opening.

11. The method of claim 10, wherein the second photoresist pattern covers an upper surface of the first photoresist pattern and the sidewall of the first opening, and wherein a portion of the second photoresist pattern covering the sidewall of the first opening defines the second opening.

12. The method of claim 1, further comprising:
    etching the anti-reflective layer and the lower surface through the second opening using the first and second photoresist patterns as etching masks to form an opening in the lower surface.

13. The method of claim 12, wherein the opening in the lower surface comprises a hole.

14. The method of claim 13, wherein a width of the hole is in range of about 1 nm to about 30 nm.

15. The method of claim 12, further comprising:
    forming an additional photoresist pattern including an opening smaller than the opening in the lower surface by at least twice performing a plasma treatment and forming a photoresist film.

16. A method of forming a photoresist pattern, comprising:
    treating a first photoresist pattern with a plasma to provide a transmuted photoresist pattern on a lower surface and an anti-reflective layer, the transmuted photoresist pattern including a plurality of first openings;
    forming a photoresist film on the transmuted photoresist pattern; and
    patterning the photoresist film to provide a second photoresist pattern contacting sidewalls of the plurality of first openings, wherein sidewalls of the second photoresist pattern define a plurality of second openings within respective ones of the plurality of first openings.

17. The method of clam 16, wherein the first photoresist pattern is formed using a first photolithographic mask having first mask openings and wherein the second photoresist pattern is formed using a second photolithographic mask having second mask openings that have dimensions equal to those of the first mask openings.

18. The method of claim 16, wherein the second photoresist pattern covers an upper surface of the transmuted photoresist pattern and the sidewalls of the plurality of first openings.

19. The method of claim 16, further comprising:
patterning the anti-reflective layer using the transmuted photoresist pattern and the second photoresist pattern as etching masks.

20. A method of forming a photoresist pattern, comprising:
forming an anti-reflective layer on a lower surface;
forming a first photoresist film on the anti-reflective layer;
patterning the first photoresist film using a photolithographic mask to provide a first photoresist pattern on the anti-reflective layer;
plasma treating the first photoresist pattern to provide a transmuted photoresist pattern, wherein reflectivity of the transmuted photoresist pattern is greater than reflectivity of the first photoresist pattern;
forming a second photoresisit film on the transmuted photoresist pattern;
patterning the second photoresisit film using the photolithographic mask to provide a second photoresist pattern contacting a sidewall of the first photoresist pattern.

21. The method of claim 20, wherein plasma treating comprises plasma treating the first photoresist pattern using a plasma generated from at least one selected from the group consisting of a hydrogen bromide (HBr) gas, a hydrogen chloride (HCl) gas, a helium (He) gas, a neon (Ne) gas, a nitrogen (N2) gas and an argon (Ar) gas.

22. The method of claim 20, wherein plasma treating comprises plasma treating the first photoresist pattern using a plasma for about 1 second to about 300 seconds.

23. The method of claim 20, wherein the second photoresist pattern covers an upper surface and the sidewall of the first photoresist pattern.

\* \* \* \* \*